United States Patent
Sato et al.

(10) Patent No.: US 7,956,313 B2
(45) Date of Patent: Jun. 7, 2011

(54) SOLID-STATE IMAGE PICKUP DEVICE

(75) Inventors: Takashi Sato, Chino (JP); Yukimasa Ishida, Shiojiri (JP); Yasushi Yamazaki, Azumino (JP)

(73) Assignee: Epson Imaging Devices Corporation, Azumino-Shi (JP)

( * ) Notice: Subject to any disclaimer, the term of this patent is extended or adjusted under 35 U.S.C. 154(b) by 289 days.

(21) Appl. No.: 12/422,616

(22) Filed: Apr. 13, 2009

(65) Prior Publication Data
US 2009/0302202 A1 Dec. 10, 2009

(30) Foreign Application Priority Data

Jun. 10, 2008 (JP) ................................. 2008-151384

(51) Int. Cl.
*H01L 27/00* (2006.01)
(52) U.S. Cl. ................ 250/208.1; 250/370.08; 348/308; 257/72; 257/292; 257/E27.133
(58) Field of Classification Search ............... 250/208.1, 250/214.1, 370.08; 257/72, 79, 291, 292, 257/E27.133; 348/302, 305, 307, 308
See application file for complete search history.

(56) References Cited

U.S. PATENT DOCUMENTS
6,909,116 B2 * 6/2005 Watanabe et al. ............... 257/72

FOREIGN PATENT DOCUMENTS
JP B2-3144091 3/2001

* cited by examiner

*Primary Examiner* — Kevin Pyo
(74) *Attorney, Agent, or Firm* — Oliff & Berridge, PLC

(57) ABSTRACT

There is provided a solid-state image pickup device that has a plurality of scanning lines that extends in a predetermined direction, a plurality of data lines that extends in a direction for intersecting the scanning lines, and a plurality of bias lines within an image pickup area on a substrate. For each of a plurality of pixels disposed in positions corresponding to intersections of the plurality of scanning lines and the plurality of data lines, a field effect transistor that is controlled by the scanning line and a photoelectric conversion element that has a electrode electrically connected to the data line through the field effect transistor and a electrode electrically connected to the bias line are formed, and a constant electric potential line for electrostatic protection is formed on the substrate. For each of bias lines, a bias line electrostatic protection circuit having a protection diode.

8 Claims, 15 Drawing Sheets

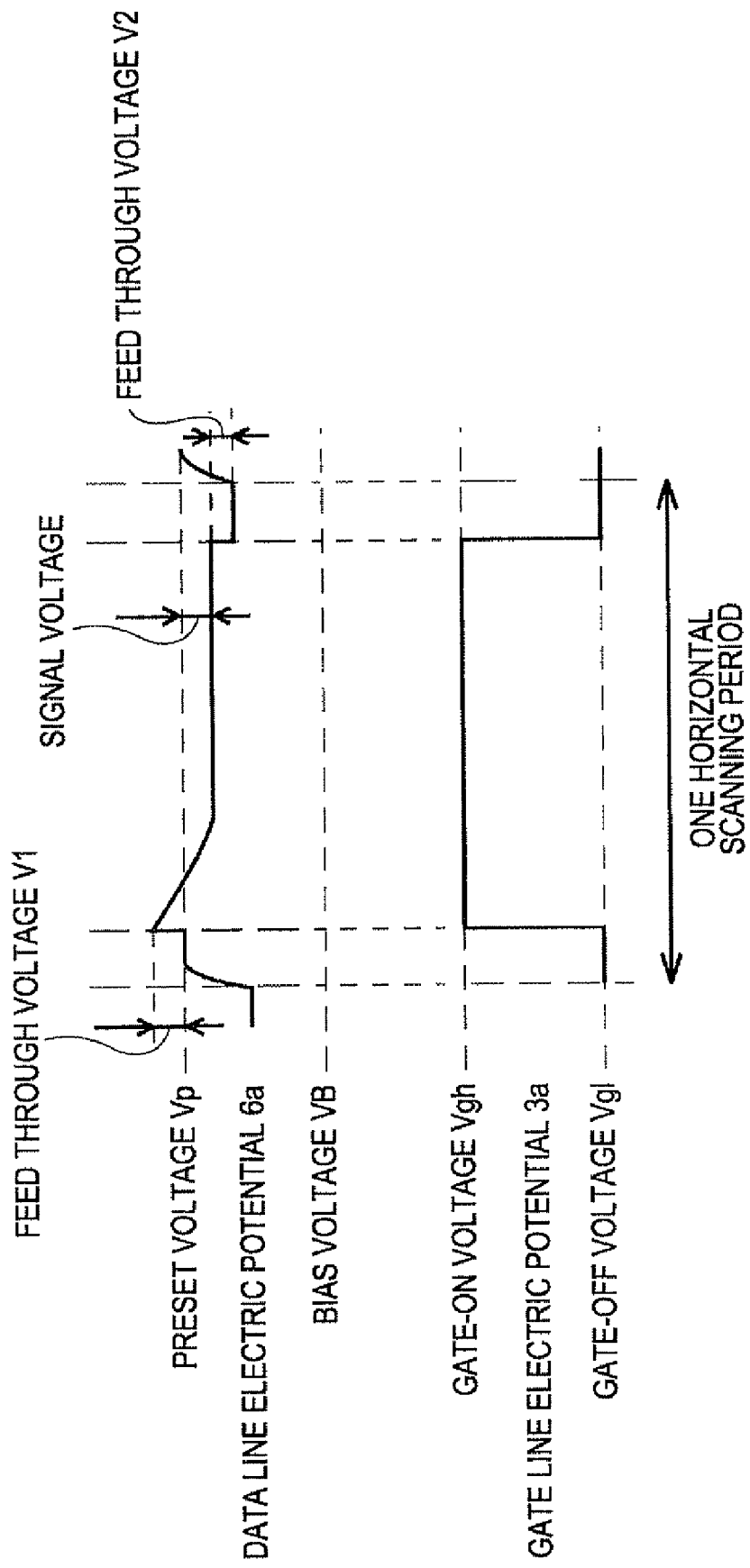

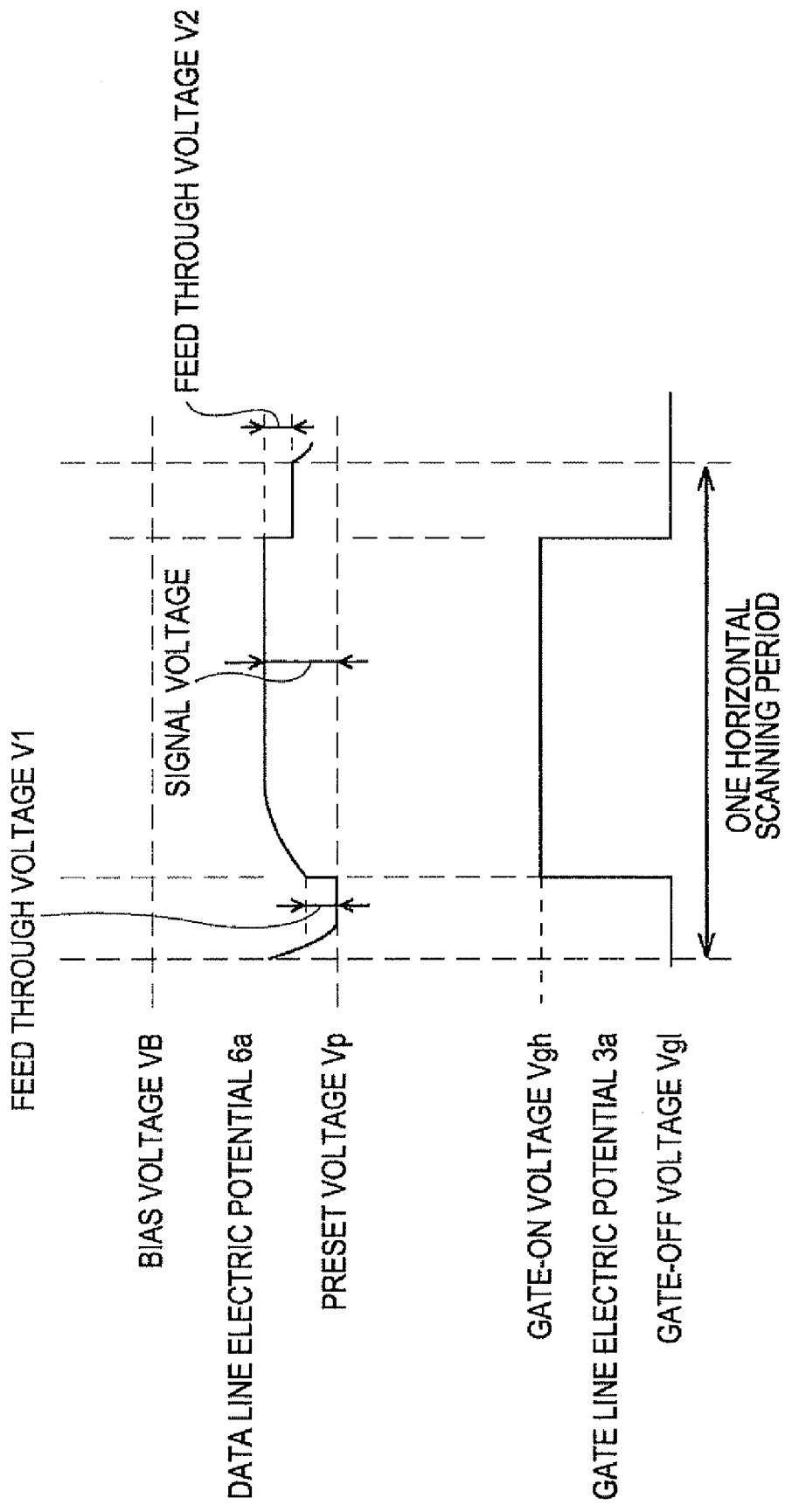

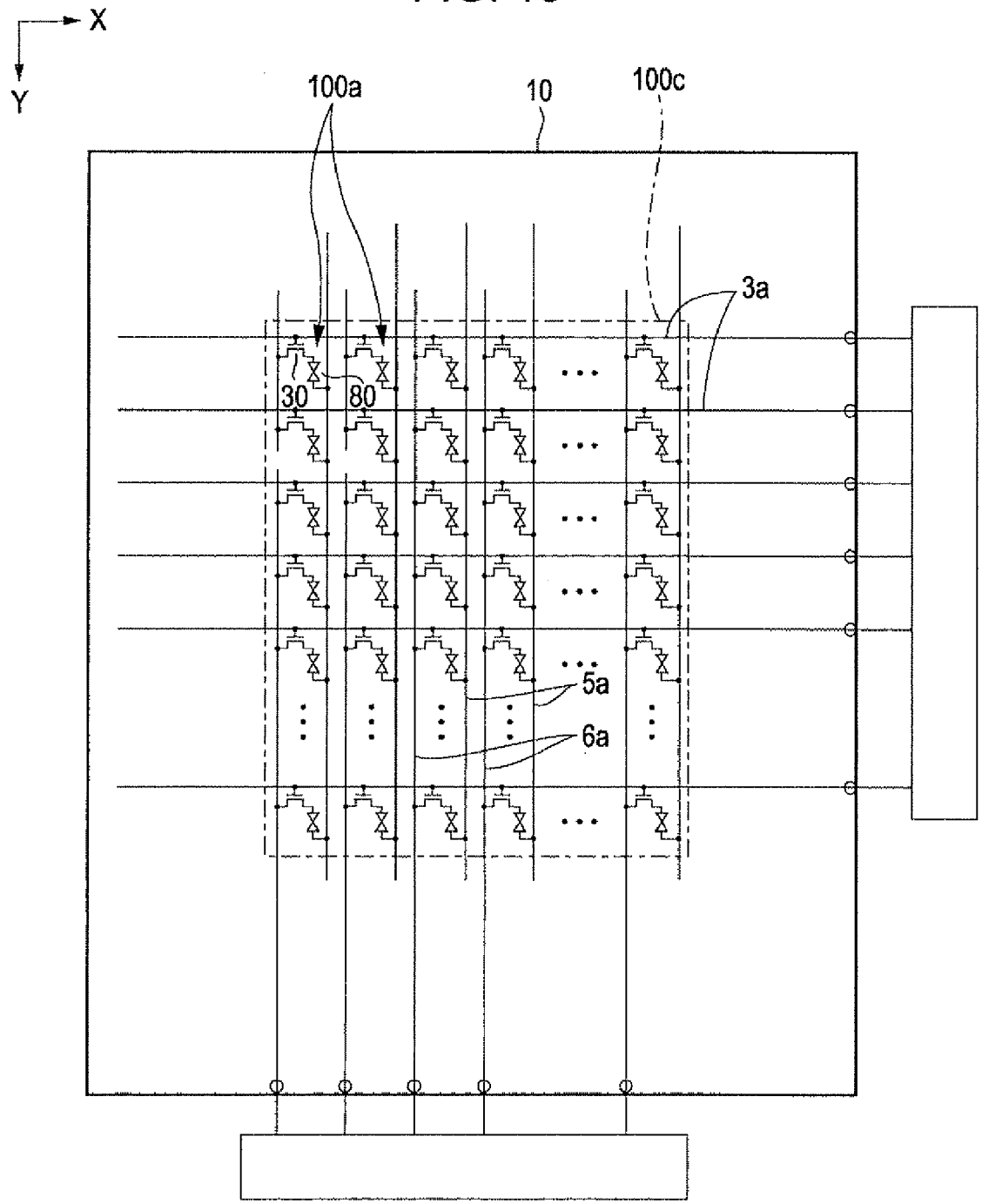

SOLID-STATE IMAGE PICKUP DEVICE

BACKGROUND

1. Technical Field

The present invention relates to a solid-state image pickup device that converts incident light into an electric signal.

2. Related Art

In medical image diagnosis, nondestructive testing, and the like, an image is picked up by using a radiation ray such as an X-ray. However, it is difficult to implement a scaling-down optical system in photographing using a radiation ray, and accordingly, image pickup at the same magnification is needed. Accordingly, in medical image diagnosis, nondestructive testing, and the like, an image pickup surface having a large size is required. Thus, solid-state image pickup devices in which a plurality of pixels is configured in a matrix shape by depositing various thin films on a substrate formed of glass or the like are used. In addition, when a two-dimensional image sensor is configured by using the solid-state image pickup device, an image pickup surface having a large size is required. Accordingly, in such a case, a plurality of pixels is configured in a matrix shape by depositing various thin films on a substrate formed of glass or the like.

In particular, for example, as shown in FIG. 15, a plurality of scanning lines 3a that extends in direction X, a plurality of data lines 6a that extends in direction Y that intersects the plurality of scanning lines 3a, and a plurality of bias lines 5a that is disposed in parallel with the data lines 6a are included within an image pickup area 100c of a base substrate 10. In addition, in positions corresponding to intersections of the scanning lines 3a and the data lines 6a, a plurality of pixels 100a is disposed. In addition, in each of the plurality of pixels 100a, a field effect transistor 30 that is controlled by the scanning line 3a and a photoelectric conversion element 80 that is formed of a PIN photo diode electrically connected to the data line 6a through the field effect transistor 30 are formed. Here, the photoelectric conversion element 80 is connected also to the bias line 5a, and accordingly, a reverse bias is applied to the photoelectric conversion element 80. Thus, when the field effect transistor 30 is turned on or off in accordance with a scanning signal that is supplied through the scanning line 3a, a signal corresponding to electric charges accumulated in each pixel 100a can be detected through the data line 6a (see Japanese Patent No. 3144091).

The configuration shown in FIG. 15 is an example for comparison with an embodiment of the invention and is not general technology.

In the solid-state image pickup device, in the middle of a manufacture process or in any finished product state after completion of the manufacture process, electrostatic breakdown can easily occur due to the influence of static electricity that is penetrated into the pixel 100a through a wiring. However, any propose for protection of the solid-state image pickup device from the static electricity has not been made.

There is a liquid crystal device as a device in which a plurality of pixels is disposed in a matrix shape. In the liquid crystal device, a configuration in which the scanning line and the data line are electrically connected to a constant electric potential line through protection diodes has been proposed for protection of the device from static electricity. Accordingly, when a countermeasure for electrostatic protection employed in the liquid crystal device is applied to the solid-state image pickup device, the solid-state image pickup device can be protected from static electricity.

However, there is a problem that occurrence of electrostatic breakdown due to the influence of static electricity cannot be protected even in a case where the countermeasure for electrostatic protection that is employed in the liquid crystal device is applied to the solid-state image pickup device.

SUMMARY

An advantage of some aspects of the invention is that it provides a configuration in which electrostatic breakdown can be protected assuredly in a solid-state image pickup device.

According to a first aspect of the invention, there is provided a solid-state image pickup device that has a plurality of scanning lines that extends in a predetermined direction, a plurality of data lines that extends in a direction for intersecting the plurality of scanning lines, and a plurality of bias lines within an image pickup area on a substrate. For each of a plurality of pixels disposed in positions corresponding to intersections of the plurality of scanning lines and the plurality of data lines, a field effect transistor that is controlled by the scanning line and a photoelectric conversion element that has a first electrode electrically connected to the data line through the field effect transistor and a second electrode electrically connected to the bias line are formed. A constant electric potential line for electrostatic protection is formed on the substrate, and, for each of the plurality of bias lines, a bias line electrostatic protection circuit having a protection diode that is electrically connected between the each of the plurality of bias lines and the constant electric potential line for electrostatic protection is configured.

In the above-described solid-state image pickup device, a configuration in which the bias line is electrically connected to the constant electric potential line through the protection diode is used, considering that the bias line extends within the image pickup area in the solid-state image pickup device, and the bias line is electrically connected to the photoelectric conversion element of each pixel, unlike the liquid crystal device. Accordingly, in the above-described solid-state image pickup device, occurrence of electrostatic breakdown in the pixel due to static electricity that is penetrated into the bias line can be prevented.

In the above-described solid-state image pickup device, it is preferable that, for at least one signal line between the scanning line and the data line, a signal line electrostatic protection circuit having a protection diode that is electrically connected between the at least one signal line and the constant electric potential line for electrostatic protection is configured. Under such a configuration, occurrence of electrostatic breakdown in the pixel due to static electricity that is penetrated into the signal line can be prevented.

In the above-described solid-state image pickup device, it is preferable that, for the scanning line, a scanning line electrostatic protection circuit having a protection diode that is electrically connected between the scanning line and the constant electric potential line for electrostatic protection is configured, and, for the data line, a data line electrostatic protection circuit having a protection diode that is electrically connected between the data line and the constant electric potential line for electrostatic protection is configured. Under such a configuration, occurrence of electrostatic breakdown in the pixel due to static electricity that is penetrated into the scanning line and the data line can be prevented.

In the above-described solid-state image pickup device, when the bias line electrostatic protection circuit and the signal line electrostatic protection circuit (the scanning line electrostatic protection circuit and/or the data line electrostatic protection circuit) are configured, it is preferable that all the protection diodes are electrically connected to the common constant electric potential line for electrostatic protection.

In the above-described solid-state image pickup device, it is preferable that, on the substrate, a plurality of the constant electric potential lines for electrostatic protection is formed, and the plurality of the constant electric potential lines for electrostatic protection are electrically connected in series through the protection diodes, and, among the plurality of the constant electric potential lines for electrostatic protection, the protection diode of the electrostatic protection circuit is electrically connected to the constant electrical potential lines other than the constant electric potential line for electrostatic protection to which a constant electric potential is directly applied. In such a case, the electric potential difference between the constant electric potential line for electrostatic protection and the bias line can be small. Accordingly, the leak current between the constant electric potential line for electrostatic protection and the bias line can be suppressed to be small, and electrostatic breakdown due to the electric potential difference can be prevented.

In the above-described solid-state image pickup device, it is preferable that the electric potential that is applied to the constant electric potential line for electrostatic protection is a preset voltage that is applied to the data line prior to reading data from the pixel.

In the above-described solid-state image pickup device, as the protection diode, at least a reverse-biased diode element in which two MIS-type (metal insulator silicon type) diodes each formed by connecting the drain or the source of the MIS-type semiconductor element to the gate are connected in parallel in the reverse direction may be used.

In the above-described solid-state image pickup device, as the protection diode, a reverse-biased diode having at least a high-electric potential protection diode that is electrically connected to the constant electric potential line for electrostatic protection, which has a high electric potential, in a reverse-biased state, and a low-electric potential protection diode, which is electrically connected to the constant electric potential line for electrostatic protection having a low electric potential in a reverse-biased state, among the constant electric potential lines for electrostatic protection, may be used. When the reverse-biased diode element is used, a reverse bias is applied to both the high-electric potential protection diode and the low-electric potential protection diode, and accordingly, the leak current can be suppressed to be small. Accordingly, when the reverse-biased diode element is connected to the data line among the bias line, the scanning line, and the data line, deterioration of a signal output through the data line can be prevented.

BRIEF DESCRIPTION OF THE DRAWINGS

The invention will be described with reference to the accompanying drawings, wherein like numbers reference like elements.

FIG. 5 is an explanatory diagram showing the signal waveform of one scanning period in an image pickup operation of the solid-state image pickup device according to Embodiment 1 of the invention.

FIG. 14 is an explanatory diagram showing the signal waveform of one scanning period in an image pickup operation of a solid-state image pickup device according to another embodiment of the invention.

FIG. 15 is a block diagram showing the electrical configuration of a solid-state image pickup device relating to a reference example of the invention.

DESCRIPTION OF EXEMPLARY EMBODIMENTS

Figure 1:
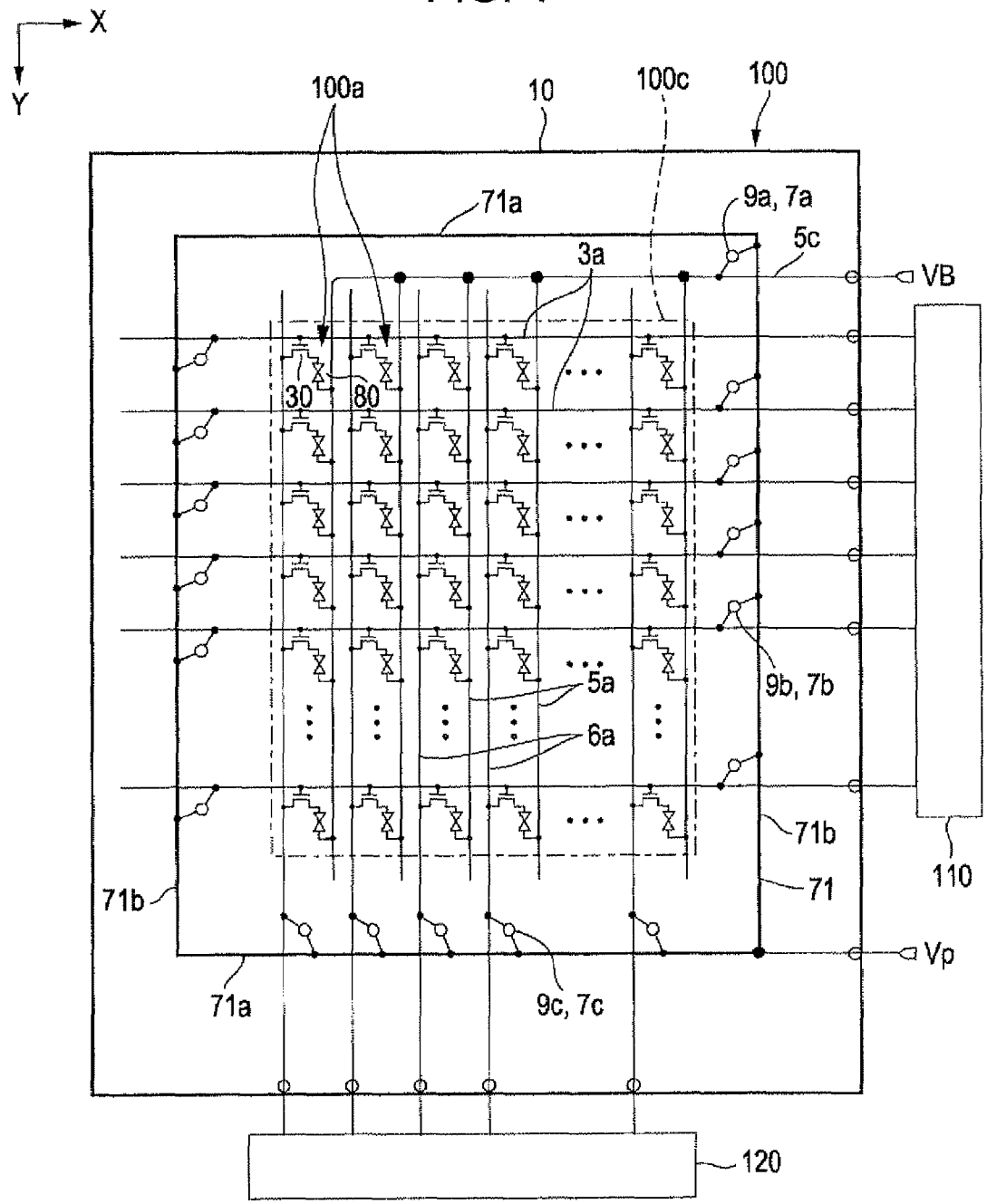
FIG. 1 is a block diagram showing the electrical configuration of a solid-state image pickup device according to Embodiment 1 of the invention.

Hereinafter, embodiments of the invention will be described. In drawings referred to in descriptions below, in order to have each layer or member in a size recognizable in the drawings, each layer or member is differently scaled. In addition, in a field effect transistor, the source and the drain are exchanged based on the conduction type and the direction of flow of the current. However, in descriptions here, for the convenience of description, it is assumed that one to which a photoelectric conversion element is connected is the drain, and the other to which a signal line (data line) is connected is the source.

Embodiment 1

Entire Configuration

Figure 2A:
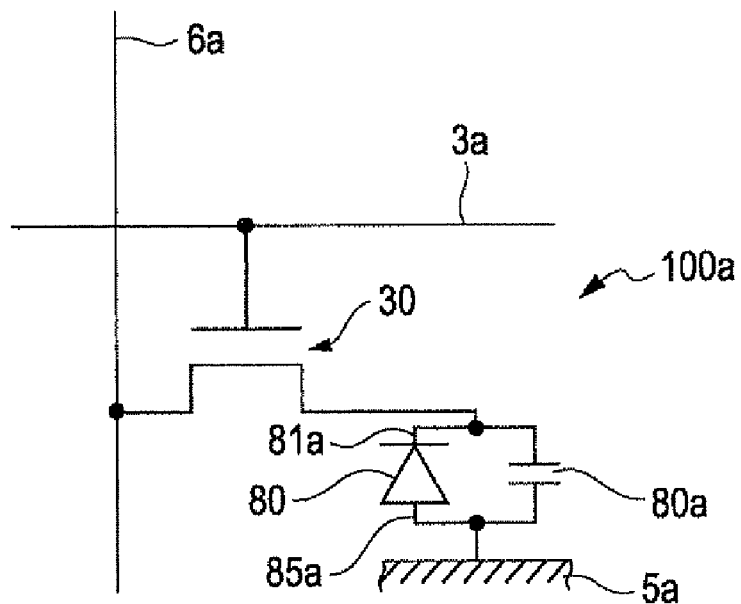
FIGS. 2A and 2B are circuit diagrams showing a configuration and another configuration of each pixel of the solid-state image pickup device according to an embodiment of the invention.
Figure 2B:
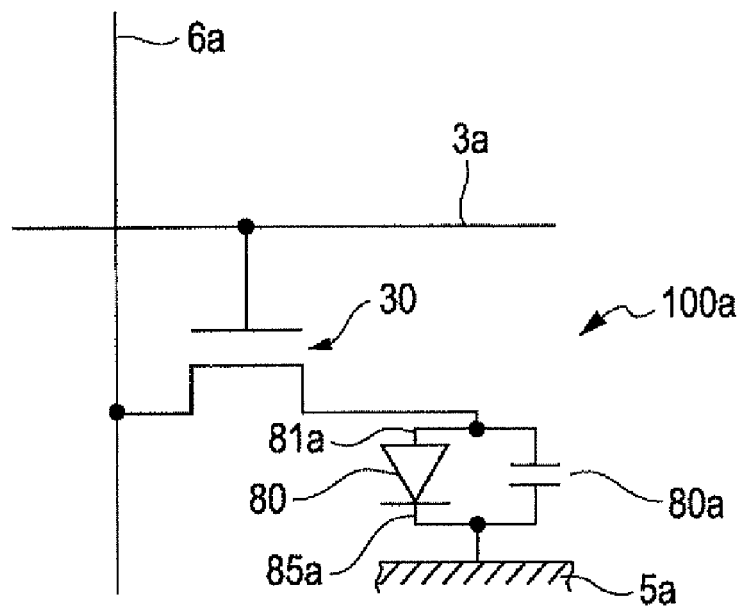
Figure 3:
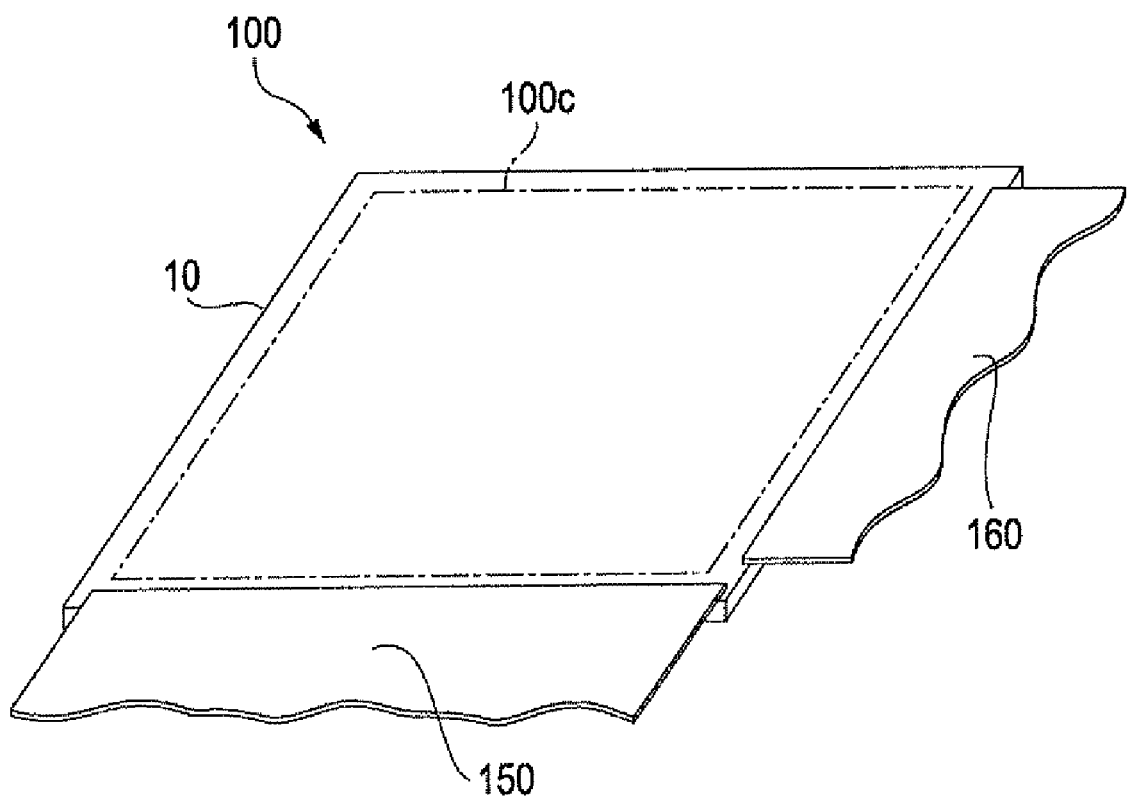
FIG. 3 is an explanatory diagram schematically showing the appearance of a solid-state image pickup device according to an embodiment of the invention.

FIG. 1 is a block diagram showing the electrical configuration of a solid-state image pickup device according to Embodiment 1 of the invention. FIGS. 2A and 2B are circuit diagrams showing a configuration and another configuration of each pixel of the solid-state image pickup device according to Embodiment 1 of the invention. FIG. 3 is an explanatory diagram schematically showing the appearance of the solid-state image pickup device according to Embodiment 1 of the invention.

The solid-state image pickup device 100 shown in FIG. 1 includes a plurality of scanning lines 3a that extends in direction X and a plurality of data lines 6a that extends in direction Y that intersects direction X. In each position corresponding to an intersection of the scanning line 3a and the data line 6a, a pixel 100a is disposed. An image pickup area 100c is configured by an area in which a plurality of the pixels 100a is disposed in a matrix shape. In each of the plurality of the pixels 100a, a photoelectric conversion element 80 that generates electric charges corresponding to the amount of incident light and a field effect transistor 30 that is electrically connected to the photoelectric conversion element 80 are formed. In this embodiment, the photoelectric conversion element 80 is formed by a PIN photo diode.

The scanning line 3a is electrically connected to the gate of the field effect transistor 30, the data line 6a is electrically connected to the source of the field effect transistor 30, and the drain of the field effect transistor 30 is electrically connected to the photoelectric conversion element 80. In this embodiments a bias line 5a extends in parallel with the data line 6a, and the bias line 5a is electrically connected to the photoelectric conversion element 80. A constant electric potential is applied to the bias line 5a so as to apply a reverse bias to the photoelectric conversion element 80. Alternatively, a configuration in which the bias line 5a extends in parallel with the scanning line 3a may be used. For applying a constant electric potential (bias voltage VB) to the bias line 5a, in this embodiment, a configuration in which a plurality of the bias lines 5a is electrically connected to one main line part 5c is used.

The plurality of the scanning lines 3a is connected to a scanning line driving circuit 110, and thus, the field effect transistors 30 of each pixel 100a are sequentially turned on and off in accordance with scanning signals (gate pulses) that are output from the scanning line driving circuit 110. In addition, the plurality of the data lines 6a is connected to a read-out circuit 120. Accordingly, electrical signals corresponding to the amounts of incident light for each pixel 100a are sequentially output to the read-out circuit 120 through the data lines 6a in accordance with the on and off operations of the field effect transistors 30. The read-out circuit 120 includes a so-called charge sensing amplifier that is configured by an operational amplifier and a capacitor.

As shown in FIG. 2A, in this embodiment, the drain of the field effect transistor 30 is electrically connected to a first electrode 81a (cathode) of the photoelectric conversion element 80, and the bias line 5a is electrically connected to a second electrode 85a (anode) of the photoelectric conversion element 80. In addition, as shown in FIG. 2B, the first electrode 81a of the photoelectric conversion element 80 that is electrically connected to the drain of the field effect transistor 30 may be used as an anode. In such a case, the second electrode 85a of the photoelectric conversion element 80 that is electrically connected to the bias line 5a becomes the cathode.

Each of the plurality of the pixels 100a includes a holding capacitor 80a. One electrode of the holding capacitor 80a is electrically connected to the drain of the field effect transistor 30, same as the first electrode 81a of the photoelectric conversion element 80. In addition, the other electrode of the holding capacitor 80a is electrically connected to the bias line 5a same as the second electrode 85a of the photoelectric conversion element 80. Accordingly, the holding capacitor 80a is electrically connected to the photoelectric conversion element 80 in parallel. The holding capacitor 80a may be configured by a depletion layer and the like that are formed in the photoelectric conversion element 80 in a case where a reverse bias is applied to the photoelectric conversion element 80. Alternatively, the holding capacitor 80a may be configured by forming a storage capacitor that is electrically connected to the pixel 80a in parallel with the photoelectric conversion element 80, in addition to the capacitance component formed by the depletion layer. In either case, the holding capacitor 80a accumulates the electric field that is generated by the photoelectric conversion element 80, and electric charges accumulated in the holding capacitor 80a correspond to the amount of light that is received by the pixel 100a.

In the solid-state image pickup device 100, the scanning lines 3a, the data lines 6a, the bias lines 5a, the pixels 100a (the photoelectric conversion elements 80, the field effect transistors 30, and the holding capacitors 80a), which are described with reference to FIG. 1, are formed on a base substrate 10 shown in FIG. 3. Here, an approximate center area of the base substrate 10 is used as the image pickup area 10c in which the pixels 100a are arranged in the matrix shape. In the example shown in FIG. 3, the scanning line driving circuit 110 and the read-out circuit 120 are formed separately from the base substrate 10. Accordingly, to a peripheral area of the base substrate 10 that surrounds the outside of the image pickup area 100c, flexible substrates 150 and 160 in which driving ICs (not shown in FIG. 3) are mounted are connected. Thus, in FIG. 1, pads of the base substrate 10 to which the flexible substrates 150 and 160 are connected are denoted by circles.

Configuration of Pixel

Figure 4A:
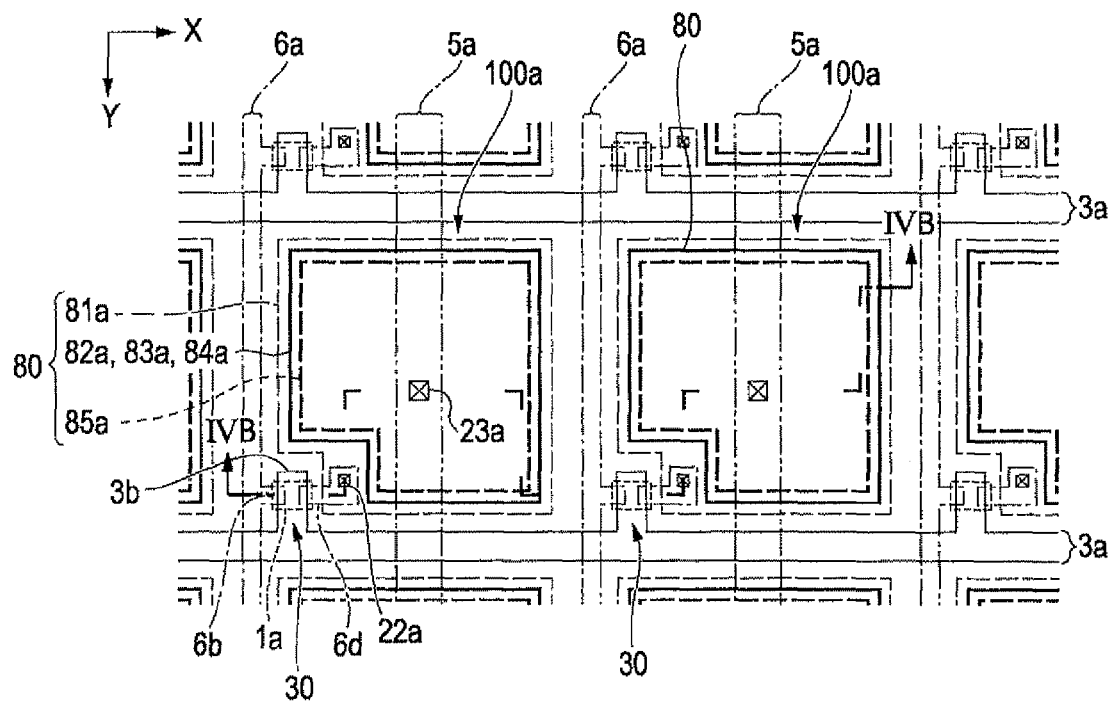
FIGS. 4A and 4B are a plan view of a plurality of adjacent pixels of the solid-state image pickup device according to Embodiment 1 of the invention and a cross-section view of one of the adjacent pixels.
Figure 4B:
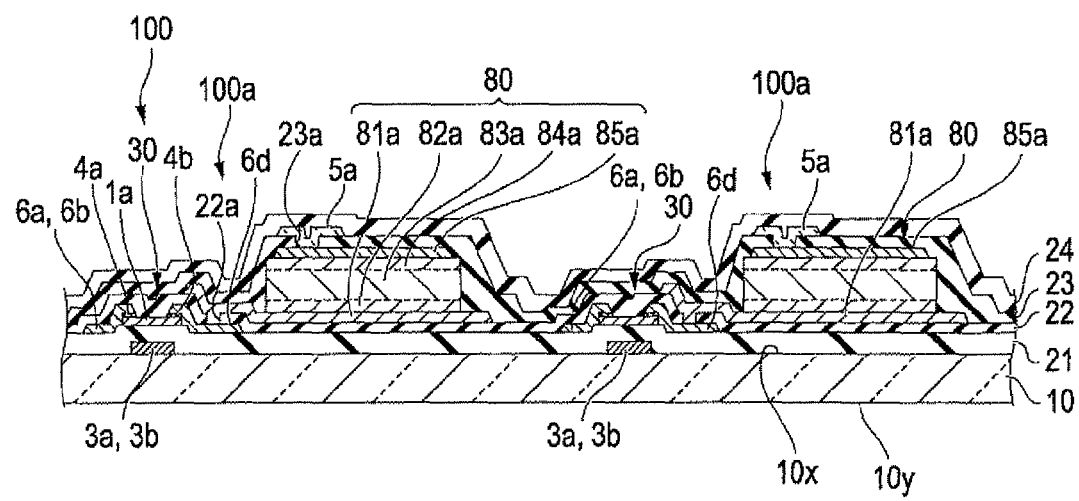

FIGS. 4A and 4B are a plan view of a plurality of adjacent pixels 100a of the solid-state image pickup device 100 according to Embodiment 1 of the invention and a cross-section view of one of the adjacent pixels 100a. FIG. 4B corresponds to a cross-section view of the solid-state image pickup device 100 taken along line IVB-IVB shown in FIG. 4A. In FIG. 4A, the scanning lines 3a and thin films that are formed simultaneously with the scanning lines 3a are denoted by thin solid lines, and the data lines 6a and thin films that are formed simultaneously with the data lines 6a are denoted by thin dot-dashed lines. Further, a semiconductor film (active layer) of the field effect transistor 30 is denoted by a thin and short dotted line, and the bias line 5a is denoted by a long dashed double-short dashed line. In addition, the first electrode 81a of the photoelectric conversion element 80 is denoted by a thin and long dotted line, a semiconductor film of the photoelectric conversion element 80 is denoted by a thick solid line, and the second electrode 85a of the photoelectric conversion element 80 is denoted by a thick and long dotted line.

As shown in FIG. 4A, on the base substrate 10, the scanning lines 3a and the data lines 6a extend in directions intersecting each other, and the pixel 100a is formed in each position corresponding to the intersection of the scanning line 3a and the data line 6a. In addition, the bias lines 5a extend to be in parallel with the data lines 6a. In this embodiment, the data line 6a extends in direction Y in a position overlapped with a boundary area of the pixel 100a adjacent thereto in direction X along the boundary area, and the bias line 5a extends in direction Y with passing the center of the pixel 100a in direction X. The scanning line 3a extends in direction X along the boundary area of the pixel 100a that is adjacent thereto in direction Y.

In the pixel 100a, the photoelectric conversion element 80 that is formed by a PIN photo diode and the field effect transistor 30 that is electrically connected to the photoelectric conversion element 80 are formed. Thus, a gate electrode 3b of the field effect transistor 30 is formed by a part of the scanning line 3a, and a source electrode 6b of the field effect transistor 30 is formed by a part of the data line 6a. In the configuration of the pixel according to this embodiment, as exemplified in FIG. 2A, a drain electrode 6d of the field effect transistor 30 is electrically connected to the first electrode 81a (cathode) of the photoelectric conversion element 80, and the bias line 5a is electrically connected to the second electrode 85a (anode) of the photoelectric conversion element 80.

The sectional configuration of the pixel 100a and the like will now be described with reference to FIGS. 4A and 4B. In the solid-state image pickup device 100 shown in FIGS. 4A and 4B, the base substrate 10 is formed of a quartz substrate, a heat-resistant glass substrate, or the like. On the upper side 10x between both sides 10x and 10y of the base substrate 10, the field effect transistor 30 is formed. The field effect transistor 30 has a bottom-gate structure in which the gate electrode 3b formed by a part of the scanning line 3a, a gate insulation film 21, a semiconductor film 1a that configures an active layer of the field effect transistor 30 and is formed of an amorphous silicon film, and contact layers 4a and 4b that are formed of amorphous silicon films in which high-density N-type impurities are doped are laminated in the described order. The end part of the semiconductor film 1a on the source side is overlapped with the data line 6a as the source electrode 6b through the contact layer 4a, and the end part of the semiconductor film 1a on the drain side is overlapped with the drain electrode 6d through the contact layer 4b. The data line 6a and the drain electrode 6d are formed of conduction films that are simultaneously formed. The scanning line 3a, for example, is a laminated film of a molybdenum film having a thickness of about 50 nm and an aluminum film having a thickness of about 250 nm. The semiconductor film 1a, for example, is an amorphous silicon film having a thickness of about 150 nm, and the gate insulation film 21, for example, is a silicon nitride film having a thickness of about 400 nm. The contact layers 4a and 4b, for example, are high-density N-type amorphous silicon film having a thickness of about 50 nm, and the data line 6a, for example, is formed of a laminated film of a molybdenum film having a thickness of about 50 nm, an aluminum film having a thickness of 250 nm, and a molybdenum film having a thickness of about 50 nm.

On the surface side of the data line 6a and the drain electrode 6d, a lower-layer insulation film 22 that is formed of a silicon nitride film or the like having a thickness of about 400 nm is formed. In the upper layer of the lower-layer insulation film 22, the first electrode 81a of the photoelectric conversion element 80 is formed, and the first electrode 81a is brought into contact with the top face of the drain electrode 6d inside a contact hole 22a, which is formed in the lower-layer insulation film 22, to be electrically connected thereto. As described above, the first electrode 81a is electrically connected to the drain of the field effect transistor 30 on a lower-layer side of the first electrode 81a. The first electrode 81a, for example, is formed of an aluminum film having a thickness of about 100 nm.

In the upper layer of the first electrode 81a, a high-density N-type semiconductor film 82a that is formed of an amorphous silicon film in which high-density N-type impurities are doped, an I-type semiconductor film 83a (intrinsic semiconductor film) that is formed of an intrinsic amorphous silicon film, and a high-density P-type semiconductor film 84a that is formed of an amorphous silicon film in which high-density P-type impurities are doped are laminated. In addition, in the upper layer of the high-density P-type semiconductor film 84a, the second electrode 85a is laminated. The photoelectric conversion element 80 is configured as a PIN photo diode that is formed by the first electrode 81a, the high-density N-type semiconductor film 82a, the I-type semiconductor film 83a, the high-density P-type semiconductor film 84a, and the second electrode 85a. The second electrode 85a, for example is formed of an ITO film having a thickness of about 90 nm, and the photoelectric conversion element 80 detects light that is incident from the side of the transparent second electrode 85a.

According to this embodiment, in order to avoid reduction of the reliability and the yield ratio due to a decrease of the withstanding electric potential in a level difference of the photoelectric conversion element 80, only the first electrode 81a of a plurality of thin films (the first electrode 81a, the high-density N-type semiconductor film 82a, the I-type semiconductor film 83a, the high-density P type semiconductor film 84a, and the second electrode 85a) that configures the photoelectric conversion element 80 is formed in an area overlapped with the contact hole 22a. However, a configuration in which the entire photoelectric conversion element 80 (all of the first electrode 81a, the high-density N-type semiconductor film 82a, the I-type semiconductor film 83a, the high-density P-type semiconductor film 84a, and the second electrode 85a) is formed in an area overlapped with the contact hole 22a may be used.

On the upper-layer side of the photoelectric conversion element 80, an upper-layer insulation film 23 that is formed of an inorganic insulation film such as a silicon nitride film having a thickness of about 400 nm is formed on the entire face of the image pickup area 100c. In addition, in the upper layer of the upper-layer insulation film 23, the bias line 5a is formed. Here, in a position of the upper-layer insulation film 23 that is overlapped with the second electrode 85a, a contact hole 23a is formed. Accordingly, the bias line 5a is overlapped with the second electrode 85a inside the contact hole 23a to be electrically connected to the second electrode 85a. The bias line 5a, for example, is formed of a laminated film of a molybdenum film having a thickness of about 50 nm, an aluminum film having a thickness of about 250 nm, and a molybdenum film having a thickness of about 50 nm.

On the upper-layer side of the bias line 5a, a surface protection layer 24 that is formed of a silicon nitride film or the like having a thickness of about 400 nm is formed. When the solid-state image pickup device 100 is used for medical image diagnosis or nondestructive testing using a radiation ray such as an X beam, a scintillator that converts a radiation beam into visible light by using a phosphor or the like is configured by the surface protection layer 24 or in the upper layer of the surface protection layer 24. In addition, in a case where an image pickup operation is performed by using a beam other than the X beam, when there is an scintillator corresponding to each wavelength of light, the light of the wavelength can be picked up. Therefore, the solid-state image pickup device 100 according to this embodiment is not limited to the X-ray image pickup device.

Operation

FIG. 5 is an explanatory diagram showing the signal waveform of one scanning period in an image pickup operation of the solid-state image pickup device according to Embodiment 1 of the invention. In FIGS. 1 and 5, in the solid-state image pickup device 100 according to this embodiment, a bias voltage VB that has an electric potential lower than that of the data line 6a is applied to the bias line 5a shown in FIG. 1. Accordingly, the photoelectric conversion element 80 is reversely biased, and thereby electric charges can be accumulated. Then, after the photoelectric conversion elements 80 of the pixels 100a disposed in the image pickup area 100c are reversely biased uniformly, image pickup data is projected onto the image pickup area 100c as light. As a result, electric charges corresponding to the amount of light are generated inside the photoelectric conversion element 80, and thereby the amount of electric charges inside the photoelectric conversion element 80 changes. Next, by sequentially changing electric potentials of the plurality of the scanning lines 3a from the gateoff voltage Vgl to the gate-on voltage Vgh, the field effect transistors 30 are sequentially turned on. Thereby electric charges of the photoelectric conversion elements 80 are discharged to the data lines 6a. Here, a time for reading data of one line in the direction of the scanning line 3a is assumed to be one horizontal scanning period shown in FIG. 5. The change in the electric potential of the data line 6a at this moment is read out by the read-out circuit 120 that is electrically connected to the data line 6a.

In this operation, before the field effect transistor 30 is turned on, the data line 6a is reset by applying a preset electric potential Vp to the data line 6a, and then, the amount of change from the preset electric potential Vp is read out by the read-out circuit 120. It is preferable that the read-out operation is performed while the field effect transistor 30 is turned on. The reason is that a feed-through voltage V2 is generated at a time when the field effect transistor is turned off and becomes a factor for causing a read-out error. In addition, the preset operation that is performed by applying the preset electric potential Vp is not necessarily needed to be employed. However, when the preset operation is not performed, the picked-up image data in the direction of the data line 6a is integrated in the data line 6a, and accordingly, it is difficult to perform the read-out operation correctly.

As described above, according to this embodiment, after the data line 6a is set to the preset voltage Vp, the electric potential of the data line 6a moves to the higher electric potential side by the feed-through voltage V1. The feed-through voltage V1 is a voltage by which the electric potential of the data line 6a is changed at a time when the gate of the field effect transistor 30 is set to the gate-on voltage Vgh. Here, when parasitic capacitance (the parasitic capacitance of the field effect transistor 30, the capacitance of the crossed part of the scanning line 3a and the data line 6a, and the like) between the scanning line 3a and the data line 6a of one pixel is denoted by CP, and the data line capacitance is denoted by Cd, the following expression is acquired.

$$(Cp/Cd) \times (Vgh - VVgl)$$

Although the feed-through voltage V1 has a value depending on the design, generally, the feed-through voltage is equal to or smaller than 1 V. When the number of the scanning lines 3a is N, Cp/Cd is 1/N. Thus, when Vgh−Vgl=25 V and N=100, the feed-through voltage is about 0.25.

Thereafter, although the voltage of the data line 6a changes due to discharge from the photoelectric conversion element 80, the absolute value of the voltage is a small value that is smaller than 1 V. For example, the capacitance of the photoelectric conversion element 80 of one pixel corresponds to the data line capacitance of ten lines of the scanning lines on the whole. In addition, the maximum value of the change in the electric potential of the voltage applied to the photoelectric conversion element 80 due to the image pickup data is "the preset voltage VP the bias voltage VB" and, generally, is about 5 V. Accordingly, in a case where there are 100 scanning lines 3a, when the electric potential of the photoelectric conversion element 80 maximally changes, a change of about "5 V×1/10=0.5 V" is made. The case of low resolution of N=100 has been considered as above, and when N=1000, a change of 1/10 times the above-described value is made.

Configuration of Electrostatic Protection Circuit for Bias Line 5, Etc.

Figure 6A:
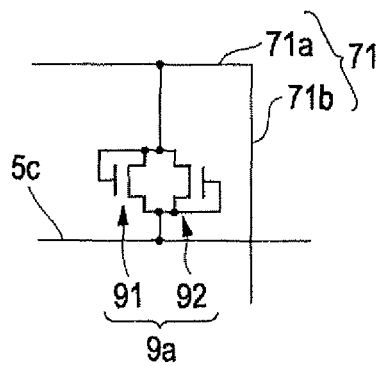
FIGS. 6A, 6B, and 6C are a circuit diagram showing the configuration of an electrostatic protection circuit that is provided for the bias line in the solid-state image pickup device according to Embodiment 1 of the invention, a plan view showing the plane configuration of the electrostatic protection circuit, and a cross-section view showing the sectional configuration of the electrostatic protection circuit.
Figure 6B:
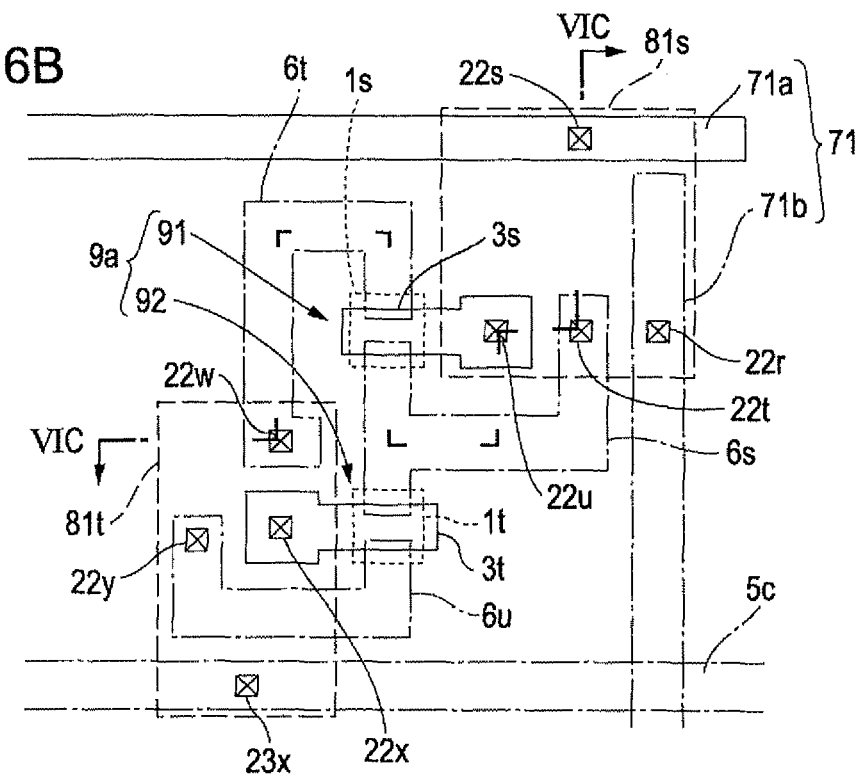
Figure 6C:
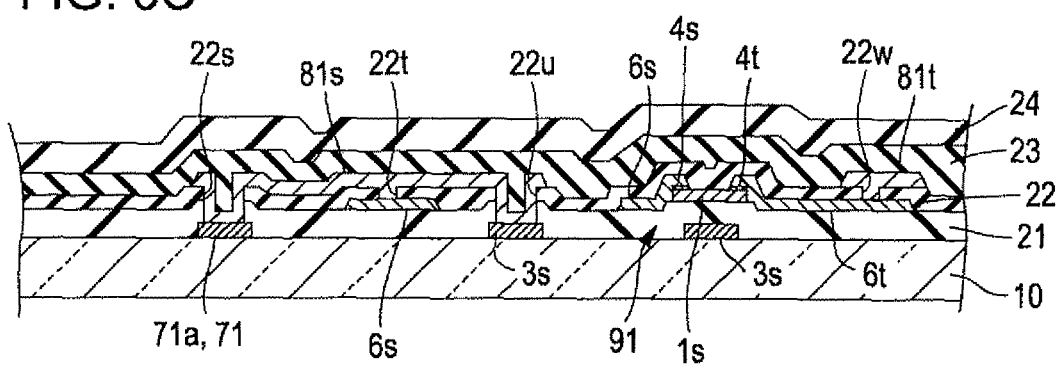

FIGS. 6A, 6B, and 6C are a circuit diagram showing the configuration of a bias line electrostatic protection circuit that is provided for the bias line 5a in the solid-state image pickup device 100 according to Embodiment 1 of the invention, a plan view showing the plane configuration of the bias line electrostatic protection circuit, and a cross-section view showing the sectional configuration of the bias line electrostatic protection circuit. FIG. 6C corresponds to a cross-section view taken along line VIC-VIC shown in FIG. 6B. In FIG. 6B, the scanning lines 3a and thin films that are formed simultaneously with the scanning lines 3a are denoted by thin solid lines, and the data Lines 6a and thin films that are formed simultaneously with the data lines 6a are denoted by thin dot-dashed lines. In addition, a semiconductor layer that is formed simultaneously with the semiconductor film (active layer) of the field effect transistor 30 is denoted by a thin and short dotted line, and a conduction film that is formed simultaneously with the bias line 5a is denoted by a long dashed double-short dashed line. In addition, a conduction film that is formed simultaneously with the first electrode 81a of the photoelectric conversion element 80 is denoted by a thin and long dotted line.

The base substrate 10 is an insulated substrate, and accordingly, the solid-state image pickup device 100 according to this embodiment may generate electrostatic breakdown in the pixels 100a due to the influence of the static electricity in the middle of the manufacturing process of the solid-state image pickup device 100 or in any finished product state after completion of manufacture thereof. Thus, according to this embodiment, electrostatic protection circuits to be described below with reference to FIGS. 1, 6, and 7 are configured for the bias line 5a, the data line 6a, and the scanning line 3a.

As shown in FIG. 1, on the base substrate 10 of the solid-state image pickup device 100 according to this embodiment, a constant electric potential line 71 for electrostatic protection is formed so as to surround the periphery of the image pickup area 100c. Here, a part 71a of the constant electric potential line 71 for electrostatic protection that extends in direction X is formed of the conduction film, described with reference to FIGS. 4A and 4B, that is formed simultaneously with the scanning line 3a. In addition, a part 71b of the constant electric potential line 71 for electrostatic protection that extends in direction Y is formed of the conduction film, described with reference to FIGS. 4A and 4B, that is formed simultaneously with the data line 6a. Accordingly, even when the constant electric potential line 71 for electrostatic protection is formed so as to surround the periphery of the image pickup area 100c, the constant electric potential line 71 for electrostatic protection intersects the scanning line 3a and the data line 6a without forming any short circuit.

In configuring the electrostatic protection circuit by using the constant electric potential line 71 for electrostatic protection, according to this embodiment, between main line parts 5c that extend in direction X from the plurality of the bias lines 5a and the constant electric potential line 71 for electrostatic protection, bias line electrostatic protection circuits 7a each having a protection diode 9a are configured. In addition, in positions corresponding to intersections of the plurality of the scanning lines 3a and the parts 71b of the constant electric potential line 71 for electrostatic protection that extends in direction Y, scanning line electrostatic protection circuits 7b each having a protection diode 9b are configured. In addition, in positions corresponding to intersections of the plurality of the data lines 6a and the parts 71a of the constant electric potential line 71 for electrostatic protection that extends in direction X, data line electrostatic protection circuits 7c each having a protection diode 9c are configured. As a result, according to this embodiment, all the protection diode 9a of the bias line electrostatic protection circuit 7a, the protection diode 9b of the scanning line electrostatic protection circuit 7b, the protection diode 9c of the data line electrostatic protection circuit 7c are electrically connected to the common constant electric potential line 71 for electrostatic protection.

Here, the protection diode 9a of the bias line electrostatic protection circuit 7a, as shown in FIG. 6A, is a reverse-biased diode element in which two MIS-type diodes 91 and 92 each formed by connecting the drain or the source of an MIS-type semiconductor element to the gate are connected in parallel with each other in the reverse direction. The MIS-type diodes 91 and 92, as will be described below with reference to FIGS. 6B and 6C, are formed simultaneously with various wirings and semiconductor elements that are formed in the image pickup area 100c.

In this embodiment, a configuration in which the protection diode 9a is electrically connected to either the part 71a of the constant electric potential line 71 for electrostatic protection that extends in direction X or the part 71b that extends in direction Y may be used. However, in this embodiment, a configuration in which the protection diode 9a is electrically connected to the part 71a of the constant electric potential line 71 for electrostatic protection that extends in direction X is exemplified.

First, the MIS-type diode 91 of the protection diode 9a has a bottom-gate structure in which a gate electrode 3s, a gate insulation film 21, a semiconductor film 1s formed of an amorphous silicon film, and contact layers 4s and 4t formed of amorphous silicon films in which high-density N-type impurities are doped are sequentially laminated in the described order. A part of the source electrode 6t is overlapped with an end part of the semiconductor film 1s on the source side through the contact layer 4t, and the drain electrode 6s is overlapped with an end part of the semiconductor film 1s on the drain side through the contact layer 4s. On the surface side of the source electrode 6t and the drain electrode 6s, a lower-layer insulation film 22 is formed. In addition, in the upper layer of the lower-layer insulation film 22, relay electrodes 81s and 81t that are formed simultaneously with the first electrode 81a of the photoelectric conversion element 80 described with reference to FIGS. 4A and 4B are formed. The relay electrode 81s is electrically connected to the drain electrode 6s through the contact holes 22r and 22t that are formed in the lower-layer insulation film 22. In addition, the relay electrode 81s is electrically connected to the part 71a of the constant electric potential line 71 for electrostatic protection that extends in direction X and the gate electrode 3s through contact holes 22s and 22u that are formed in the lower-layer insulation film 22 and the gate insulation film 21. In the MIS-type diode 91 configured as above, the source serves as a cathode, and the drain serves as an anode.

Although illustration of the cross-section of the MIS-type diode 92 is omitted, as shown in FIG. 6B, the MIS-type diode 92 has a bottom-gate structure in which a gate electrode 3t, a gate insulation film, a semiconductor film 1t formed of an amorphous silicon film, and a contact layer formed of an amorphous silicon film in which high-density N-type impurities are doped are sequentially laminated in the described order. A part of the source electrode 6t is overlapped with an end part of the semiconductor film 1t on the source side, and the drain electrode 6u is overlapped with an end part of the semiconductor film 1t on the drain side. On the surface side of the source electrode 6t and the drain electrode 6u, the lower-layer insulation film 22 (see FIG. 6C) is formed. The relay electrode 81t that is formed in the upper layer of the lower-layer insulation film 22 is electrically connected to the source electrode 6t and the drain electrode 6u through contact holes 22w and 22y that are formed in the lower-layer insulation film 22. In addition, the relay electrode 81t is electrically connected to the gate electrode 3t through a contact hole 22x that is formed in the lower-layer insulation film 22 and the gate insulation film 21. In the upper-layer insulation film 23, a contact hole 23x is formed, and the main line part 5c of the bias line 5a is electrically connected to the relay electrode 81t through the contact hole 23x. In the MIS-type diode 92 configured as above, the source serves as a cathode, and the drain serves as an anode.

Configuration of Electrostatic Protection Circuit for Data line 6a, etc.

Figure 7A:
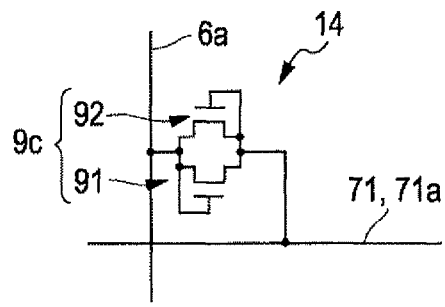
FIGS. 7A, 7B, and 7C are a circuit diagram showing the configuration of an electrostatic protection circuit that is provided for the data line in the solid-state image pickup device according to Embodiment 1 of the invention, a plan view showing the plane configuration of the electrostatic protection circuit, and a cross-section view showing the sectional configuration of the electrostatic protection circuit.
Figure 7B:
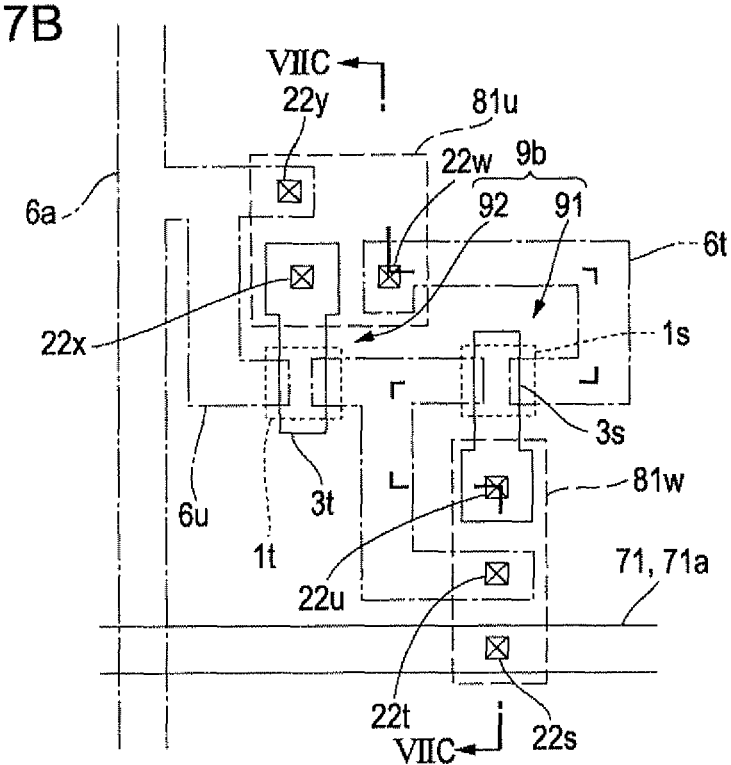
Figure 7C:
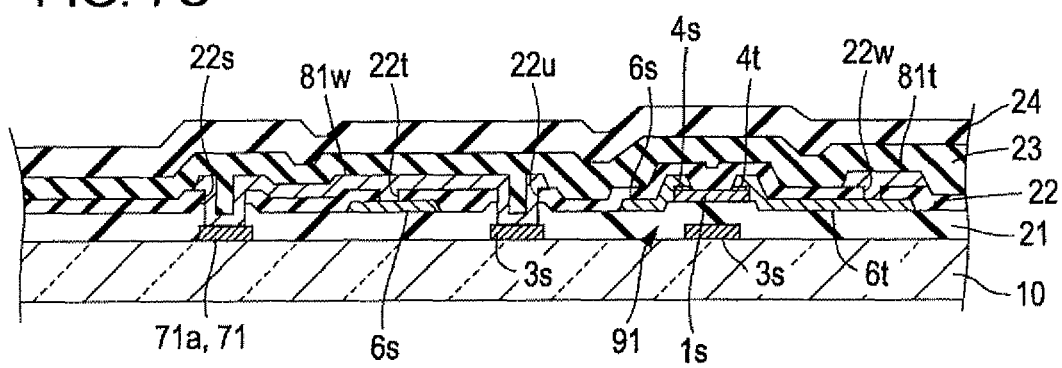

FIGS. 7A, 7B, and 7C are a circuit diagram showing the configuration of an data line electrostatic protection circuit that is provided for the data line 5a in the solid-state image pickup device 100 according to Embodiment 1 of the invention, a plan view showing the plane configuration of the electrostatic protection circuit for the data line, and a cross-section view showing the sectional configuration of the electrostatic protection circuit for the data line. FIG. 7C corresponds to a cross-section view taken along line VIIC-VIIC shown in FIG. 7B. The basic configuration of the protection diode 9c of the data line electrostatic protection circuit 7c is the same as that of the protection diode 9a of the bias line electrostatic protection circuit 7c. Thus, a same reference sign is assigned to each common part, and a description thereof is omitted here. In FIG. 7B, the scanning lines 3a and thin films that are formed simultaneously with the scanning lines 3a are denoted by thin solid lines, and the data lines 6a and thin films that are formed simultaneously with the data lines 6a are denoted by thin dot-dashed lines. In addition, a semiconductor layer that is formed simultaneously with the semiconductor film (active layer) of the field effect transistor 30 is denoted by a thin and short dotted line, and a conduction film that is formed simultaneously with the first electrode 81a of the photoelectric conversion element 80 is denoted by a thin and long dotted line.

As shown in FIG. 7A, the protection diode 9c of the data line electrostatic protection circuit 7c, as the protection diode 9a, is a reverse-biased diode element in which two MIS-type diodes 91 and 92 each formed by connecting the drain or the source of an MIS-type semiconductor element to the gate are connected in parallel with each other in the reverse direction. The MIS-type diodes 91 and 92, as the MIS-type diodes 91 and 92 of the protection diode 9a, are formed simultaneously with various wirings and semiconductor elements that are formed in the image pickup area 10c.

In other words, as shown in FIGS. 7B and 7C, the MIS-type diode 91 of the protection diode 9c also has the bottom-gate structure in which a gate electrode 3s, a gate insulation film 21, a semiconductor film 1s formed of an amorphous silicon film, and contact layers 4s and 4t formed of amorphous silicon films in which high-density N-type impurities are doped are sequentially laminated in the described order. A part of the source electrode 6t is overlapped with an end part of the semiconductor film 1s on the source side through the contact layer 4t, and the drain electrode 6s is overlapped with an end part of the semiconductor film 1s on the drain side through the contact layer 4s. On the surface side of the source electrode 6t and the drain electrode 6s, the lower-layer insulation film 22 (see FIG. 7C) is formed, In addition, in the upper layer of the lower-layer insulation film 22r relay electrodes 81w and 81t that are formed simultaneously with the first electrode 81a of the photoelectric conversion element 80 described with reference to FIGS. 4A and 4B are formed. The relay electrode 81w is electrically connected to the drain electrode 6s through the contact hole 22t that are formed in the lower-layer insulation film 22. In addition, the relay electrode 81w is electrically connected to the part 71a of the constant electric potential line 71 for electrostatic protection that extends in direction X and the gate electrode 3s through contact holes 22z and 22z that are formed in the lower-layer insulation film 22 and the gate insulation film 21. In the MIS-type diode 91 configured as above, the source serves as a cathode, and the drain serves as an anode.

Although illustration of the cross-section of the MIS-type diode 92 is omitted, as shown in FIG. 7B, the MIS-type diode 92 has the bottom-gate structure in which a gate electrode 3t, a gate insulation film, a semiconductor film It formed of an amorphous silicon film, and a contact layer formed of an amorphous silicon film in which high-density N-type impurities are doped are sequentially laminated in the described order. A part of the source electrode 6t is overlapped with an end part of the semiconductor film 1t on the source side, and the drain electrode 6u is overlapped with an end part of the semiconductor film 1t on the drain side. On the surface side of the source electrode 6t and the drain electrode 6u, the lower-layer insulation film 22 (see FIG. 7C) is formed. The relay electrode 81u that is formed in the upper layer of the lower-layer insulation film 22 is electrically connected to the drain electrode 6w that is formed of a part of the data line 6a through a contact hole 22y that is formed in the lower-layer insulation film 22. In addition, the relay electrode 81u is electrically connected to the gate electrode 3t through a contact hole 22x that is formed in the lower-layer insulation film 22 and the gate insulation film 21. In the MIS-type diode 92 configured as above, the source serves as a cathode, and the drain serves as an anode.

Although two MIS-type diodes 91 and 92 of the protection diode 9b configured as described above are connected to one data line 6a, a sum W1 of channel widths of the MIS-type diodes 91 and 92 that are connected to one data line 6a is set to be smaller than a sum W2 of the channel widths of the field effect transistors 30 of each pixel 100a that are connected to one data line 6a. Accordingly, even when the electric potential of the data line 6a leaks through the MIS-type diodes 91 and 92, the influence of the leakage can be negligible. It is preferable that the sum W1 of the channel widths of the MIS-type diodes 91 and 92 is smaller than 1/10 times the sum W2 of the channel widths of the field effect transistors 30 of each pixel 100a that are connected to one data line 6a. In addition, it is more preferable that the sum W1 of the channel widths is smaller than 1/100 times the sum W2 of the channel widths of the field effect transistors 30 of each pixel 100a. In other words, when the channel width of the field effect transistor 30 of each pixel 100a is about 10 µm and the number of connections is 100, the sum W1 of the channel widths of the MIS-type diodes 91 and 92 is preferably equal to or smaller than 1 mm, is more preferably equal to or small than 100 µm, and is much more preferably equal to or smaller than 10 µm. In addition, even when the electric potential of the data line 6a leaks through the field effect transistors 30 of each pixel 100a, the influence of the leakage can be negligible.

Configuration of Electrostatic Protection Circuit for Scanning Line 3a

The configuration of the protection diode 9b of the scanning line electrostatic protection circuit 7b is the same as that of the protection diode 9b, and thus, a description thereof is omitted here. In other words, in the scanning line electrostatic protection circuit 7b, as the data line electrostatic protection circuit 7c, bi-directional diode elements (the protection diode 9b and the MIS-type diodes 91 and 92) are formed between a wiring that is formed simultaneously with the data line 6a and a wiring that is formed simultaneously with the scanning line 3a, Accordingly, the configuration of the protection diode 9b, as that of the protection diode 9c, is configured as described with reference to FIGS. 7A, 7B, and 7C.

Figure 8A:
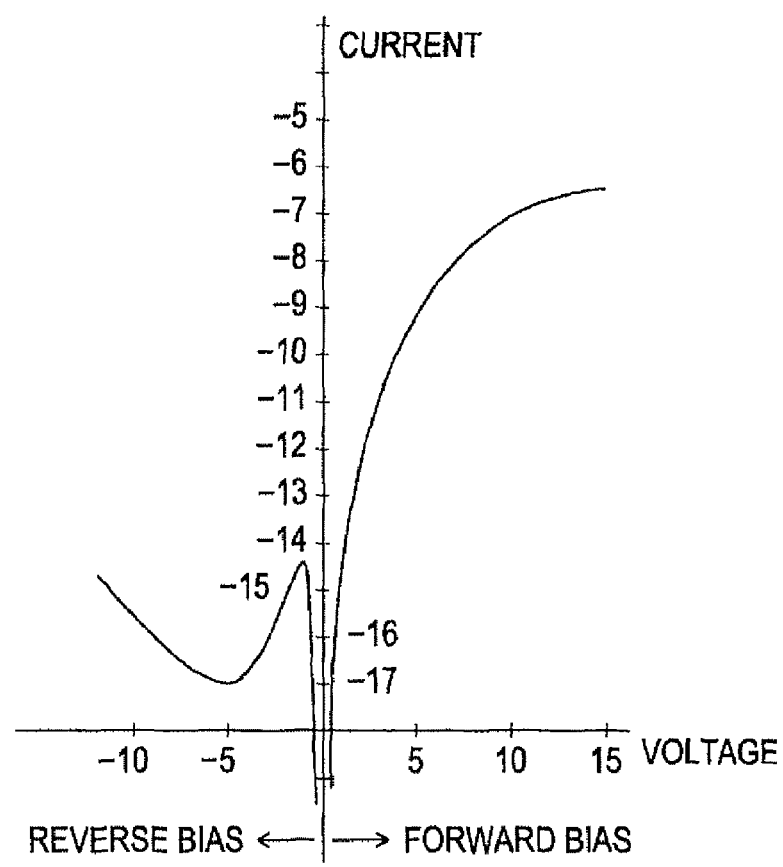
FIGS. 8A and 8B is an explanatory diagram showing the current to voltage characteristics of one MIS-type diode that configures a protection diode used in the solid-state image pickup device according to Embodiment 1 of the invention and an explanatory diagram showing the current to voltage characteristics of the protection diode.
Figure 8B:
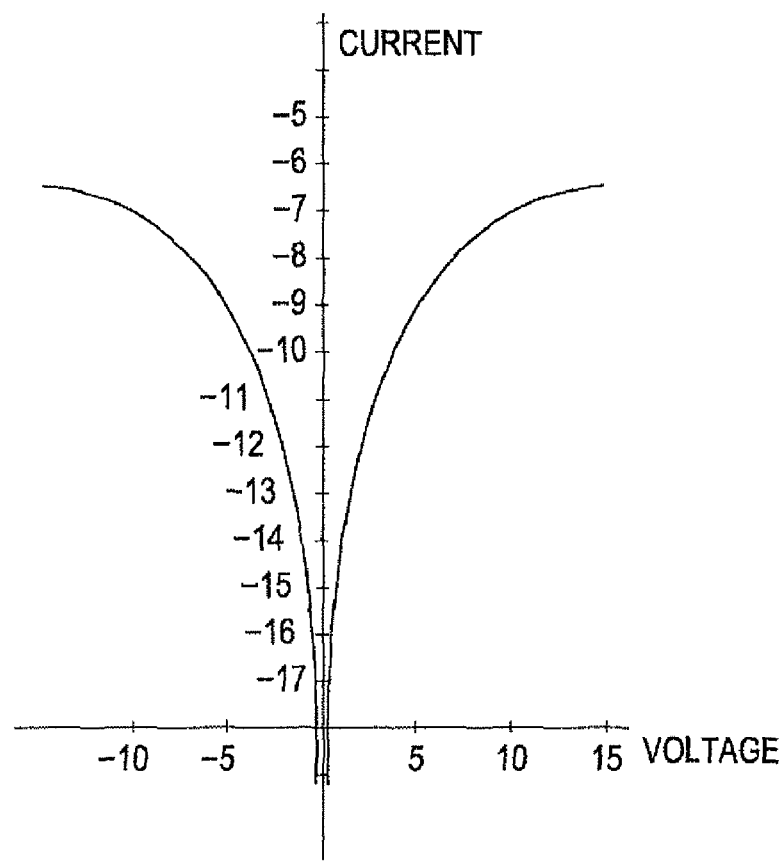

Electric Potential Applied to Constant Electric Potential Line 71 for Electrostatic Protection FIGS. 8A and 8B is an explanatory diagram showing the current to voltage characteristics of one MIS-type diode that configures a protection diode used in the solid-state image pickup device 100 according to Embodiment 1 of the invention and an explanatory diagram showing the current to voltage characteristics of the protection diode.

In the protection diodes 9a, 9b, and 9c that are configured as shown in FIGS. 6 and 7, the current to voltage characteristics of one MIS-type diode 91 or 92 are shown to be represented in FIG. 8A. Accordingly, the current to voltage characteristics of the protection diodes 9a, 9b, and 9c that are formed by electrically connecting the MIS-type diodes 91 and 92 in parallel with each other in the reverse direction are shown to be represented in FIG. 8B. As can be known from the figures, as a voltage applied to both ends decreases, the leak current rapidly decreases.

Thus, according to this embodiment, the preset voltage Vp that is described with reference to FIG. 5 as the constant electric potential is applied to the constant electric potential line 71 for electrostatic protection. This voltage has a small electric potential difference from that of the data line 6a, and thus, even when electrostatic protection is performed for the data line 6a, the leak current flowing from the data line 6a to the constant electric potential line 71 for electrostatic protection is small. Accordingly, a signal output from each pixel 100a to the read-out circuit 120 through the data line 6a does not deteriorate. In other words, when the bias voltage VB is applied to the constant electric potential line 71 for electrostatic protection, an electric potential difference of about 5 V is generated. Accordingly, the leak current is larger than that of a case where the preset voltage Vp is applied, and therefore a signal that is output to the read-out circuit 120 from each pixel 100a through the data line 6a may easily deteriorate. However, when the configuration in which the preset voltage Vp is applied to the constant electric potential line 71 for electrostatic protection is used, the electric potential differences between the constant electric potential line 71 for electrostatic protection and the scanning line 3a, the data line 6a, and the bias line 5a (the main line part 5c) are small. Accordingly, the insulation breakdown in intersection parts of wirings can be prevented.

Major Advantages of this Embodiment

As described above, in the solid-state image pickup device 100 according to this embodiment, a configuration in which the bias line 5a that extends within the image pickup area 100c is electrically connected to the constant electric potential line 71 for electrostatic protection through the protection diode 9a is employed. Accordingly, occurrence of electrostatic breakdown in the pixel 10a due to static electricity penetrated into the bias line 5a can be prevented.

In addition, in the solid-state image pickup device 100 according to this embodiment, a configuration in which the scanning line 3 and the data line 6a are electrically connected to the constant electric potential line 71 for electrostatic protection through the protection diodes 9b and 9c is employed. Accordingly, occurrence of electrostatic breakdown in the pixel 100a due to static electricity penetrated into the scanning line 3 and the data line 6a can be prevented.

In addition, for performing electrostatic protection for the bias line 5a, the scanning line 3, and the data line 6a, the common constant electric potential line 71 for electrostatic protection is used, and the voltage applied to the constant electric potential line 71 for electrostatic protection is the preset voltage Vp. Accordingly, the electric potential difference between the constant electric potential line 71 for electrostatic protection and the data line 6a is small. Therefore, even when electrostatic protection is performed for the data line 6a, a leak current flowing from the data line 6a to the constant electric potential line 71 for electrostatic protection is small. As a result, deterioration of a signal output to the read-out circuit 120 from each pixel 100a through the data line 6a does not occur. In addition, when the configuration in which the preset voltage vp is applied to the constant electric potential line 71 for electrostatic protection is used, electric potential differences between the scanning line 3a, the data line 6a, and the bias line 5a (main line part 5c) and the constant electric potential line 71 for electrostatic protection are small. Therefore, insulation breakdown in intersection parts of wirings can be prevented.

Embodiment 2

Figure 9:
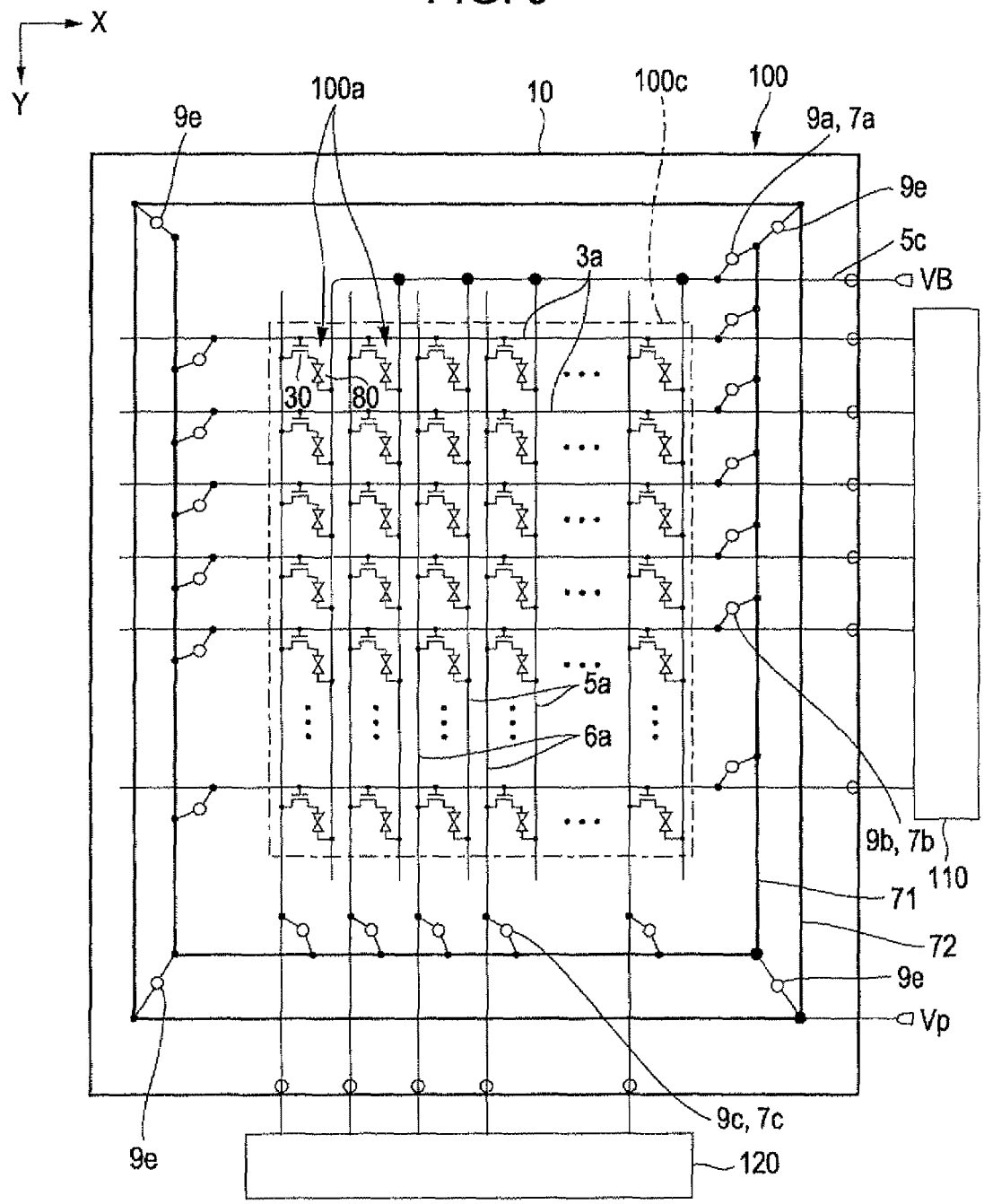
FIG. 9 is a block diagram showing the electrical configuration of a solid-state image pickup device according to Embodiment 2 of the invention.

FIG. 9 is a block diagram showing the electrical configuration of a solid-state image pickup device according to Embodiment 2 of the invention. The basic configuration of this embodiment is the same as that of Embodiment 1. Thus, a same reference sign is assigned to each common part, and a description thereof is omitted here.

As shown in FIG. 9, also in the solid-state image pickup device 100 according to this embodiment, same as that according to Embodiment 1, on the outer side of the image pickup area 100c of the base substrate 10, a constant electric potential line for electrostatic protection is formed so as to surround the image pickup area 100c. However, in this embodiment, two constant electric potential lines 71 and 72 for electrostatic protection are formed doubly. Here, between the constant electric potential lines 71 and 72 for electrostatic protection, the outer constant electric potential line 72 for electrostatic protection is formed in a closed rectangular shape in which the image pickup area 100c is completed surrounded. On the other hand, the inner constant electric potential line 71 for electrostatic protection extends on only three sides among four sides of the image pickup area 100c and is not formed in a part facing a side opposite to the side on which the read-out circuit 120 is disposed. The main line part 5c of the bias line 5a extends in direction X in a part in which the constant electric potential line 71 for electrostatic protection is discontinued.

Also in this embodiment, parts of the constant electric potential lines 71 and 72 for electrostatic protection that extend in direction X are formed of the conduction film that is formed simultaneously with the scanning line 3a, described with reference to FIGS. 4A and 4B. In addition, parts of the constant electric potential lines 71 and 72 for electrostatic protection that extend in direction Y are formed of the conduction film that is formed simultaneously with the data line 6a, described with reference to FIGS. 4A and 4B. Accordingly, even when the constant electric potential lines 71 and 72 for electrostatic protection are formed so as to surround the periphery of the image pickup area 10c, the constant electric potential lines 71 and 72 for electrostatic protection intersect the main line parts 5c of the bias lines 5a, the scanning lines 3a, and the data lines 6a without forming any short circuit.

In configuring the electrostatic protection circuit by using the constant electric potential lines 71 and 72 for electrostatic protection, according to this embodiment, bias line electrostatic protection circuits 7a each having a protection diode 9a are configured between the main line parts 5c that extend in direction x from the plurality of the bias lines 5a and the constant electric potential line 71 for electrostatic protection. In addition, in positions corresponding to intersections of the plurality of the scanning lines 3a and the parts 71b of the constant electric potential line 71 for electrostatic protection that extends in direction Y, scanning line electrostatic protection circuits 7b each having a protection diode 9b are configured. In addition, in positions corresponding to intersections of the plurality of the data lines 6a and the parts 71a of the constant electric potential line 71 for electrostatic protection that extends in direction X, data line electrostatic protection circuits 7c each having a protection diode 9c are configured. As a result, according to this embodiment, all the protection diode 9a of the bias line electrostatic protection circuit 7a, the protection diode 9b of the scanning line electrostatic protection circuit 7b, and the protection diode 9c of the data line electrostatic protection circuit 7c are electrically connected to the common constant electric potential line 71 for electrostatic protection.

Here, the constant electric potential line 71 for electrostatic protection and the constant electric potential line 72 for electrostatic protection are electrically connected to each other through the protection diodes 9e in parts corresponding to corners of the base substrate 10. Thus, according to this embodiment, the preset voltage Vp is directly applied only to the constant electric potential line 72 for electrostatic protection.

In the solid-state image pickup device 100 configured as above, the protection diodes 9a, 9b, and 9c, as described with reference to FIGS. 6 and 7, are reverse-biased diode elements in which two MIS-type diodes 91 and 92 each formed by connecting the drain or the source of an MIS-type semiconductor element to the gate are connected in parallel with each other in the reverse direction. In addition, the protection diode 9e, same as the protection diodes 9a, 9b, and 9c, is a reverse-biased diode element in which two MIS-type diodes 91 and 92 each formed by connecting the drain or the source of an MIS-type semiconductor element to the gate are connected in parallel with each other in the reverse direction.

As described above, according to this embodiment, electrostatic protection circuits 7a, 7b, and 7c having the protection diodes 9a, 9b, and 9c are configured for the bias lines 5a, the scanning lines 3, and the data lines 6a that extend within the image pickup area 100c. Accordingly, the occurrence of electrostatic breakdown in the pixel 10a due to static electricity that is penetrated into the bias lines 5a, the scanning lines 3, and the data lines 6a can be prevented.

In addition, to the constant electric potential line 71 for electrostatic protection between the constant electric potential lines 71 and 72 for electrostatic protection that are electrically connected through the protection diode 9e, the protection diodes 9a, 9b, and 9c are connected, and the preset voltage Vp is applied to the constant electric potential line 72 for electrostatic protection. Thus, the electric potential difference between the constant electric potential line 71 for electrostatic protection and the data line 6a can be small, and accordingly, even when electrostatic protection for the data line 6a is performed, a leak current flowing from the data line 6a to the constant electric potential line 71 for electrostatic protection is small. Accordingly, deterioration of a signal output from each pixel 10a to the read-out circuit 120 through the data line 6a does not occur. In addition, when the configuration in which the preset voltage Vp is applied to the constant electric potential line 72 for electrostatic protection is used, electric potential differences between the scanning line 3a, the data line 6a, and the bias line 5a (main line part 5c) and the constant electric potential lines 71 and 72 for electrostatic protection are small. Therefore, insulation breakdown in intersection parts of wirings can be prevented.

Embodiment 3

Figure 10:
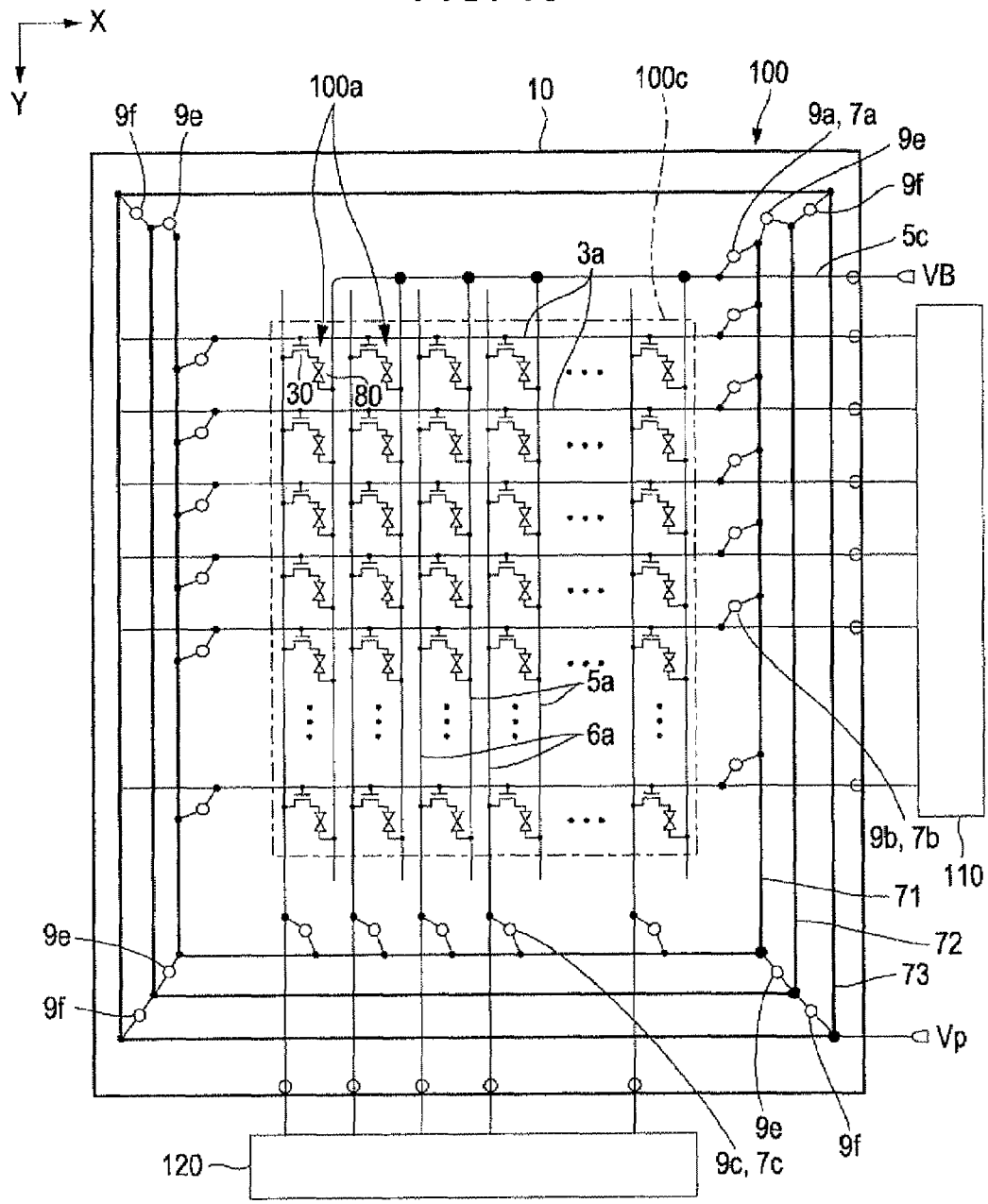
FIG. 10 is a block diagram showing the electrical configuration of a solid-state image pickup device according to Embodiment 3 of the invention.

FIG. 10 is a block diagram showing the electrical configuration of a solid-state image pickup device according to Embodiment 3 of the invention. The basic configuration of this embodiment is the same as that of Embodiment 1 or 2. Thus, a same reference sign is assigned to each common part, and a description thereof is omitted here.

As shown in FIG. 10, also in the solid-state image pickup device 100 according to this embodiment, same as in Embodiment 1, on the outer side of the image pickup area 100c of the base substrate 10, a constant electric potential line for electrostatic protection is formed so as to surround the image pickup area 100c. However, in this embodiment, three constant electric potential lines 71, 72, and 73 for electrostatic protection are formed triply. Here, among the constant electric potential lines 71, 72 and 73 for electrostatic protection, the outermost constant electric potential line 73 for electrostatic protection is formed in a closed rectangular shape in which the image pickup area 100c is completed surrounded. On the other hand, the inner constant electric potential lines 71 and 72 for electrostatic protection extend on only three sides among four sides of the image pickup area 100c and are not formed in a part facing a side opposite to the side on which the read-out circuit 120 is disposed. The main line part 5c of the bias line 5a extends in direction X in a part in which the constant electric potential lines 71 and 72 for electrostatic protection are discontinued.

Also in this embodiment, parts of the constant electric potential lines 71, 72, and 73 for electrostatic protection that extend in direction X are formed of the conduction film that is formed simultaneously with the scanning line 3a, described with reference to FIGS. 4A and 4B. In addition, parts that extend in direction Y are formed of the conduction film that is formed simultaneously with the data line 6a, described with reference to FIGS. 4A and 4B. Accordingly, even when the constant electric potential lines 71, 72, and 73 for electrostatic protection are formed so as to surround the periphery of the image pickup area 100c, the constant electric potential lines 71 and 72 for electrostatic protection intersect the main line parts 5c of the bias lines 5a, the scanning lines 3a, and the data lines 6a without forming any short circuit.

In configuring the electrostatic protection circuit by using the constant electric potential lines 71, 72, and 73 for electrostatic protection, according to this embodiment, an electrostatic protection circuit 7a for the bias line that has a protection diode 9a is configured between the main line parts 5c that extend in direction X from the plurality of the bias lines 5a and the constant electric potential line 71 for electrostatic protection. In addition, in positions corresponding to intersections of the plurality of the scanning lines 3a and the parts 71b of the constant electric potential line 71 for electrostatic protection that extends in direction Y, scanning line electrostatic protection circuits 7b each having a protection diode 9b are configured. In addition, in positions corresponding to intersections of the plurality of the data lines 6a and the parts 71a of the constant electric potential line 71 for electrostatic protection that extends in direction X, data line electrostatic protection circuits 7c each having a protection diode 9c are configured. As a result, according to this embodiment, all the protection diode 9a of the bias line electrostatic protection circuit 7a, the protection diode 9b of the scanning line electrostatic protection circuit 7b, the protection diode 9c of the data line electrostatic protection circuit 7c are electrically connected to the common constant electric potential line 71 for electrostatic protection.

Here, the constant electric potential line 71 for electrostatic protection and the constant electric potential line 72 for electrostatic protection are electrically connected to each other through the protection diodes 9e in parts corresponding to corners of the base substrate 10. In addition, the constant electric potential line 72 for electrostatic protection and the constant electric potential line 73 for electrostatic protection are electrically connected to each other through the protection diodes 9f in parts corresponding to corners of the base substrate 10. In applying constant electric potentials to the constant electric potential lines 71, 72, and 73 for electrostatic protection, according to this embodiment, the preset voltage Vp is directly applied only to the constant electric potential line 73 for electrostatic protection.

In the solid-state image pickup device 100 configured as above, the protection diodes 9a, 9b, and 9c, as described with reference to FIGS. 6 and 7, are reverse-biased diode elements in which two MIS-type diodes 91 and 92 each formed by connecting the drain or the source of an MIS-type semiconductor element to the gate are connected in parallel with each other in the reverse direction. In addition, the protection diodes 9e and 9f, same as the protection diodes 9a, 9b, and 9c, are reverse-biased diode elements in which two MIS-type diodes 91 and 92 each formed by connecting the drain or the source of an MIS-type semiconductor element to the gate are connected in parallel with each other in the reverse direction.

As described above, according to this embodiment, electrostatic protection circuits 7a, 7b, and 7c having the protection diodes 9a, 9b, and 9c are configured for the bias lines 5a, the scanning lines 3, and the data lines 6a that extend within the image pickup area 100c. Accordingly, the occurrence of electrostatic breakdown in the pixel 100a due to static electricity that is penetrated into the bias lines 5a, the scanning lines 3, and the data lines 6a can be prevented.

In addition, to the constant electric potential line 71 for electrostatic protection among the constant electric potential lines 71, 72 and 73 for electrostatic protection that are electrically connected through the protection diode 9e, the protection diodes 9a, 9b, and 9c are connected, and the preset voltage Vp is applied to the constant electric potential line 73 for electrostatic protection. Thus, the electric potential difference between the constant electric potential line 71 for electrostatic protection and the data line 6a can be small, and accordingly, even when electrostatic protection for the data line 6a is performed, a leak current flowing from the data line 6a to the constant electric potential line 71 for electrostatic protection is small. Accordingly, deterioration of a signal output from each pixel 100a to the read-out circuit 120 through the data line 6a does not occur. In addition, when the configuration in which the preset voltage Vp is applied to the constant electric potential line 73 for electrostatic protection is used, electric potential differences between the scanning line 3a, the data line 6a, and the bias line 5a (main line part 5c) and the constant electric potential lines 71, 72, and 73 for electrostatic protection are small. Therefore, insulation breakdown in intersection parts of wirings can be prevented.

Embodiment 4

Figure 11:
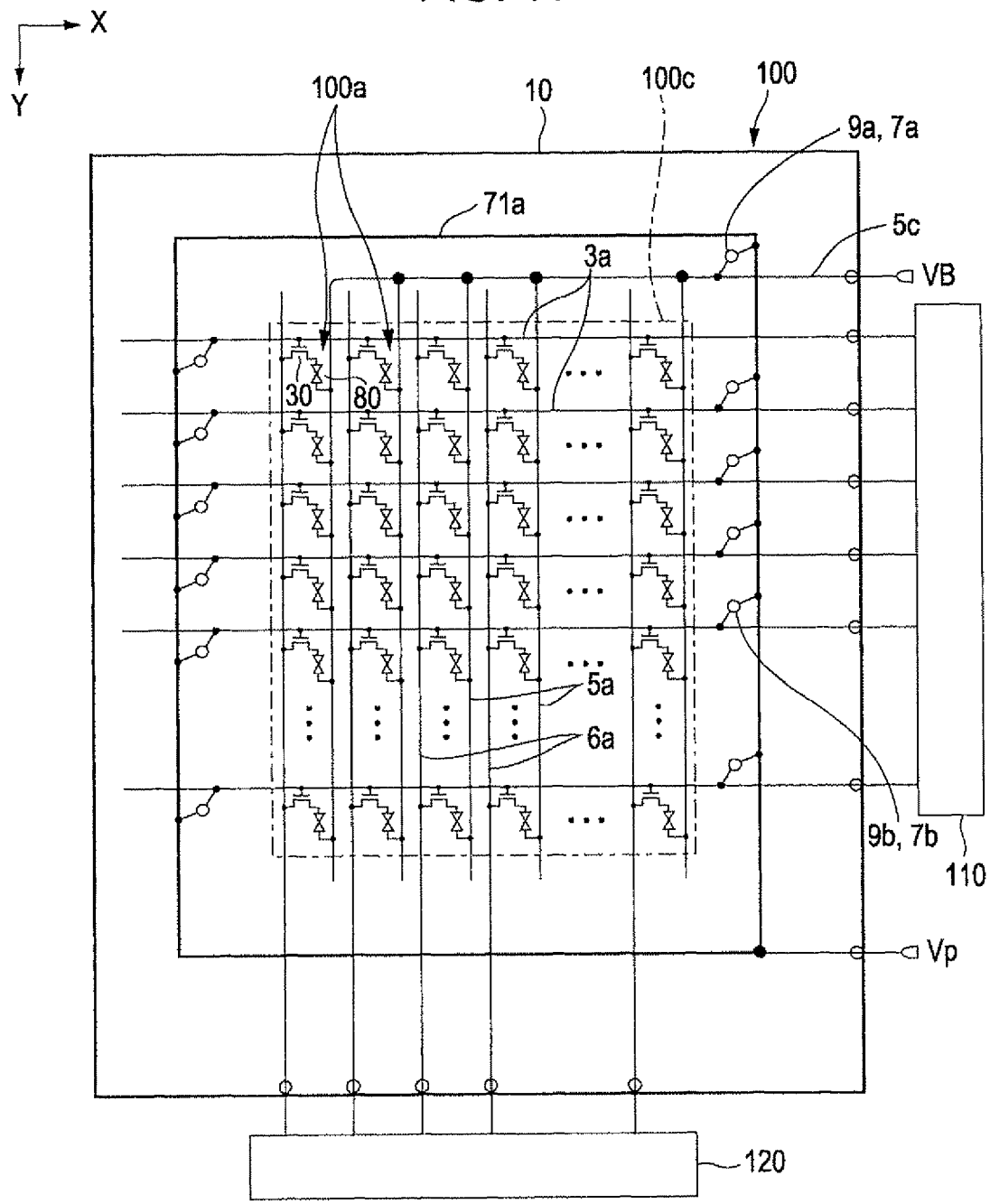
FIG. 11 is a block diagram showing the electrical configuration of a solid-state image pickup device according to Embodiment 4 of the invention.

FIG. 11 is a block diagram showing the electrical configuration of a solid-state image pickup device according to Embodiment 4 of the invention. The basic configuration of this embodiment is the same as that of Embodiment 1. Thus, a same reference sign is assigned to each common part, and a description thereof is omitted here.

As shown in FIG. 11, also in the solid-state image pickup device 100 according to this embodiment, same as in Embodiment 1, on the outer side of the image pickup area 100c of the base substrate 10, a constant electric potential line 71 for electrostatic protection is formed so as to surround the image pickup area 100c. To the constant electric potential line 71 for electrostatic protection, the preset voltage VP is applied. Also in this embodiment, same as in Embodiment 1, bias line electrostatic protection circuits 7a each having a protection diode 9a are configured between main line parts 5c that extend in direction X from the plurality of the bias lines 5a and the constant electric potential line 71 for electrostatic protection. In addition, in positions corresponding to intersections of the plurality of the scanning lines 3a and the parts 71b of the constant electric potential line 71 for electrostatic protection that extends in direction Y, scanning line electrostatic protection circuits 7b each having a protection diode 9b are configured.

However, according to this embodiment, in positions corresponding to intersections of the plurality of the data lines 6a and the part 71a of the constant electric potential line 71 for electrostatic protection that extends in direction X, the protection diodes 9c described with reference to FIGS. 1 and 7 are not formed.

Accordingly, even when the electrostatic protection circuits 7a and 7c are provided for the purpose of preventing the electrostatic breakdown in the pixels 100a due to static electricity that is penetrated into the bias line 5a and the scanning line 3, a leak current flowing from the data line 6a to the constant electric potential line 71 for electrostatic protection can be ignored. Thus, deterioration of a signal output from each pixel 100a to the read-out circuit 120 through the data line 6a does not occur. In addition, when the configuration in which the preset voltage Vp is applied to the constant electric potential line 71 for electrostatic protection is used, electric potential differences between the scanning line 3a, the data line 6a, and the bias line 5a (main line part 5c) and the constant electric potential line 71 for electrostatic protection are small. Therefore, insulation breakdown in intersection parts of wirings can be prevented.

As in this embodiment, the configuration in which the electrostatic protection circuits 7a and 7c are disposed in the bias line 5a and the scanning line 3 with any protection circuit not disposed in the data line 6a may be used in Embodiments 2 or 3.

Embodiment 5

Figure 12:
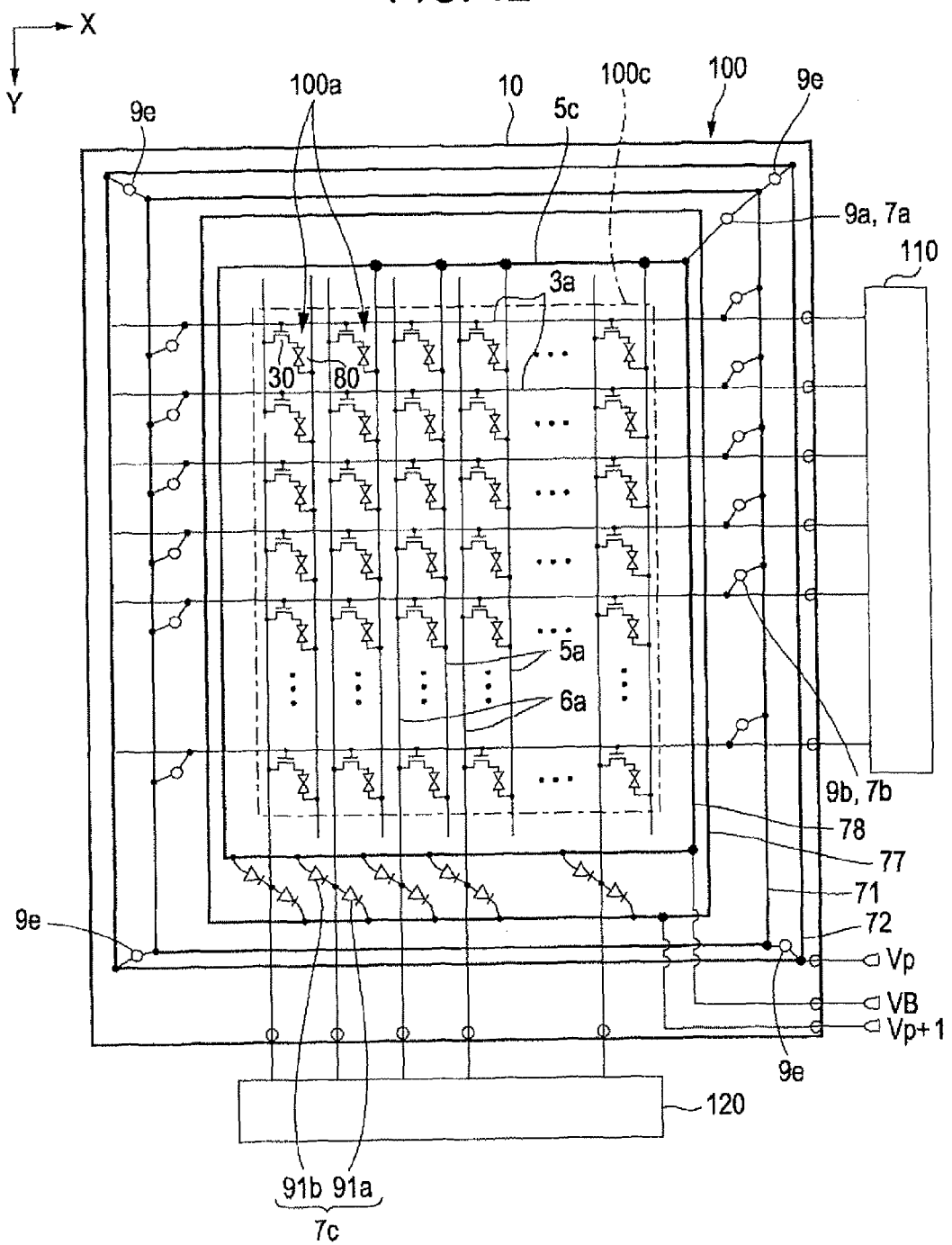
FIG. 12 is a block diagram showing the electrical configuration of a solid-state image pickup device according to Embodiment 5 of the invention.
Figure 13A:
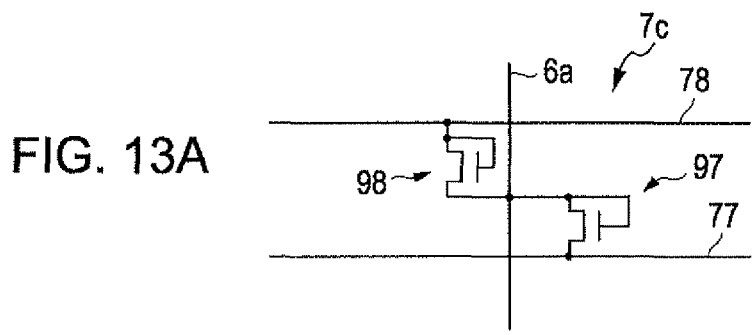
FIGS. 13A, 13B, and 13C are a circuit diagram showing the configuration of an electrostatic protection circuit that is provided for the data line in the solid-state image pickup device according to Embodiment 5 of the invention, a plan view showing the plane configuration of the electrostatic protection circuit, and a cross-section view showing the sectional configuration of the electrostatic protection circuit.
Figure 13B:
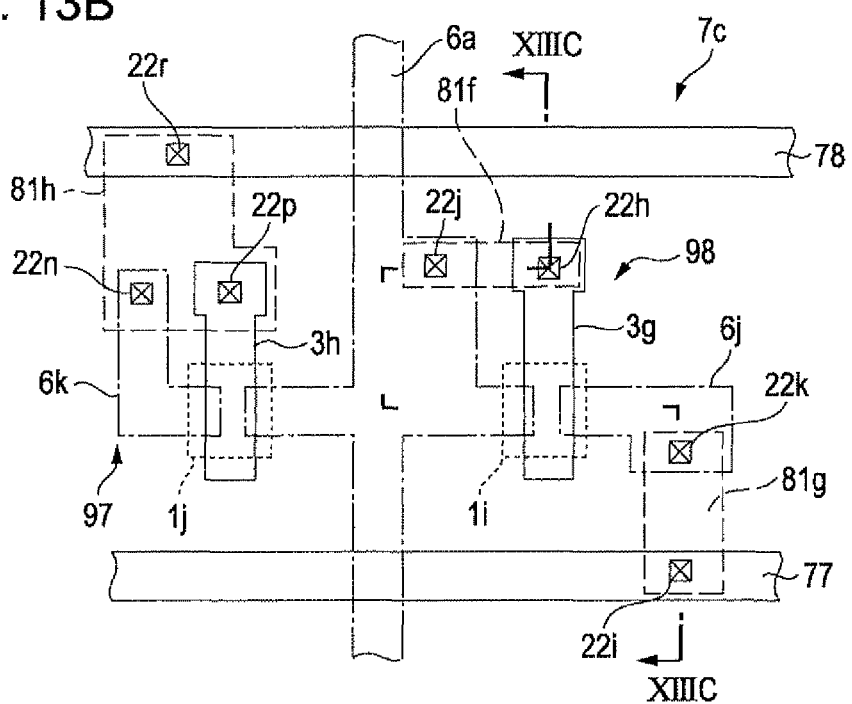
Figure 13C:
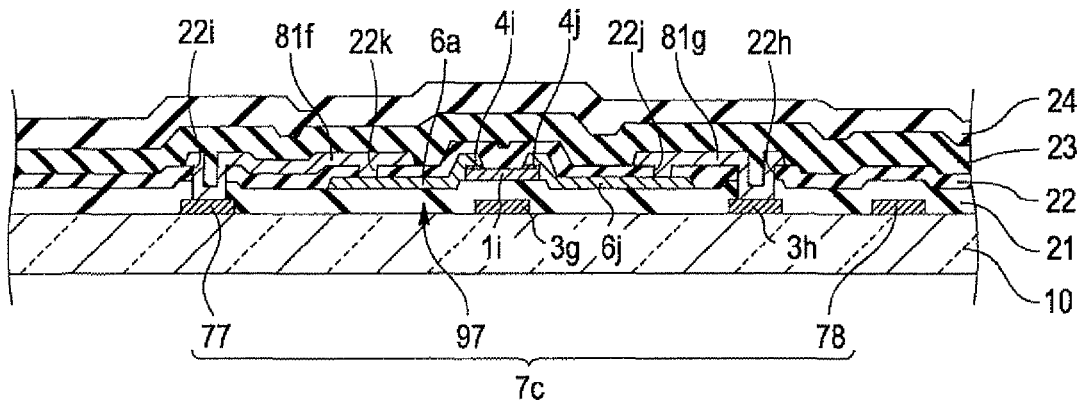

FIG. 12 is a block diagram showing the electrical configuration of a solid-state image pickup device according to Embodiment 5 of the invention. FIGS. 13A, 13B, and 13C are a circuit diagram showing the configuration of an electrostatic protection circuit that is provided for the data line 6a in the solid-state image pickup device 100 according to Embodiment 5 of the invention, a plan view showing the plane configuration of the first electrostatic protection circuit, and a cross-section view showing the sectional configuration of the first electrostatic protection circuit. FIG. 13C corresponds to a cross-section view taken along line XIIIC-XIIIC shown in FIG. 13B.

In Embodiments 1 to 4, reverse-biased diode elements in which two MIS-type diodes each formed by connecting the drain or the source of an MIS-type semiconductor element to the gate are connected in parallel with each other in the reverse direction are used as all the protection diodes. However, in this embodiment, a form in which the above-described reverse-biased diode element and a reverse-biased diode element having a high-electric potential protection diode that is electrically connected to a constant electric potential line for electrostatic protection having a high electric potential in a reverse-biased state and a low-electric potential protection diode that is electrically connected to a constant electric potential line for electrostatic protection having a low electric potential in a reverse-biased state are used together will be described. This embodiment is an example in which the configuration using the above-described reverse-biased diode element and the reverse-biased diode element having the low and high electric potential protection diodes together is applied to Embodiment 2. Accordingly, the basic configuration of this embodiment is the same as that of Embodiment 1, and thus, a same reference sign is assigned to each common part, and a description thereof is omitted here.

As shown in FIG. 12, also in the solid-state image pickup device 100 according to this embodiment, as that according to Embodiment 2, on the outer side of the image pickup area 100c of the base substrate 10, two constant electric potential lines 71 and 72 for electrostatic protection are doubly formed so as to surround the image pickup area 100c.

However, in this embodiment, unlike Embodiment 2, both the constant electric potential lines 71 and 72 for electrostatic protection are formed in a closed rectangular shape that completely surrounds the image pickup area 100c. In addition, the main line part 5c of the bias line 5a is formed in a closed rectangular shape that completely surrounds the image pickup area 100c and configures a part of a low-electric potential line 78 to be described later.

Also in this embodiment, same as in the above-described embodiments, parts of the constant electric potential lines 71 and 72 for electrostatic protection that extend in direction X are formed of the conduction film that is formed simultaneously with the scanning line 3a, described with reference to FIGS. 4A and 4B. In addition, parts of the constant electric potential lines 71 and 72 for electrostatic protection that extend in direction Y are formed of the conduction film that is formed simultaneously with the data line 6a, described with reference to FIGS. 4A and 4B. Accordingly, even when the constant electric potential lines 71 and 72 for electrostatic protection are formed so as to surround the periphery of the image pickup area 100c, the constant electric potential lines 71 and 72 for electrostatic protection intersect the main line parts 5c of the bias lines 5a, the scanning lines 3a, and the data lines 6a without forming any short circuit.

In configuring the electrostatic protection circuit by using the constant electric potential lines 71 and 72 for electrostatic protection, according to this embodiment, bias line electrostatic protection circuits 7a each having a protection diode 9a are configured between the main line parts 5c that extend in direction X from the plurality of the bias lines 5a and the constant electric potential line 71 for electrostatic protection. In addition, in positions corresponding to intersections of the plurality of the scanning lines 3a and the parts 71b of the constant electric potential line 71 for electrostatic protection that extends in direction Y, scanning line electrostatic protection circuits 7b each having a protection diode 9b are configured.

Here, the constant electric potential line 71 for electrostatic protection and the constant electric potential line 72 for electrostatic protection are electrically connected to each other through the protection diodes 9e in parts corresponding to corners of the base substrate 10. Thus, according to this embodiment, the preset voltage Vp is directly applied only to the constant electric potential line 72 for electrostatic protection. Accordingly, electric potential differences between the scanning line 3a, the data line 6a, and the bias line 5a (the main line part 5c and the low-electric potential line 78) and the constant electric potential lines 71 and 72 for electrostatic protection are small, and thereby insulation breakdown in the intersection parts of wirings can be prevented.

In addition, the protection diodes 9a, 9b, and 9c, as described with reference to FIGS. 6 and 7, are reverse-biased diode elements in which two MIS-type diodes 91 and 92 each formed by connecting the drain or the source of an MIS-type semiconductor element to the gate are connected in parallel with each other in the reverse direction.

In addition, according to this embodiment, the electrostatic protection circuits 7c are configured for the plurality of the data lines 6a. However, according to this embodiment, in the electrostatic protection circuit 7c for the data line 6a, not the bidirectional diode element described with reference to FIGS. 6 and 7 but the reverse-biased diode element described with reference to FIGS. 13A, 13B, and 13C is used.

According to this embodiment, in configuring the electrostatic protection circuit 7c for the data line 6a, as shown in FIGS. 12 and 13A, first, a high-electric potential line 77 to which an electric potential equal to or higher than the highest electric potential applied to the data line 6a is applied and a low-electric potential line 78 to which an electric potential equal to or lower than the lowest electric potential applied to the data line 6a is applied are formed in the electrostatic protection circuit 7c for the data line 6a so as to surround the image pickup area 100c of the base substrate 10. The high-electric potential line 77 and the low-electric potential line 78 are formed as common lines that independently surround the image pickup area 100c, and different electric potentials are applied thereto.

According to this embodiment, for a reason to be described later, an electric potential that is the same as an electric potential (the bias voltage VB) applied to the bias line 5a is applied to the low-electric potential line 78. Thus, the main line part 5c to which a plurality of the bias lines 5a is connected configures a part of the low-electric potential line 78. Accordingly, the low electric potential line 78 also serves as a main line for the plurality of the bias lines 5a. In addition, the bias line 5a and the low-electric potential line 78 are formed in different layers, a structure in which the bias line 5a and the low-electric potential line 78 are electrically connected to each other through a contact hole that is formed in the insulation film 1s employed.

In addition, in the electrostatic protection circuit 7c, a high-electric potential protection diode 97 that is electrically connected to the data line 6a and the high-electric potential line 77 in a reverse-biased state at a position corresponding to an intersection of the data line 6a and the high-electric potential line 77 and a low-electric potential protection diode 98 that is electrically connected to the data line 6a and the low-electric potential line 78 in a reverse-biased state at a position corresponding to an intersection of the data line 6a and the low-electric potential line 78 are formed in an outer area of the image pickup area 100c of the base substrate 10.

The high-electric potential line 77, the low-electric potential line 78, the high-electric potential protection diode 97, and the low-electric potential protection diode 98, as shown in FIGS. 13B and 13C, are formed simultaneously with various wirings and semiconductor elements that are formed in the image pickup area 100c.

First, parts of both the high-electric potential line 77 and the low-electric potential line 78 that extend in direction X for intersecting the data line 6a are formed of the conduction film that is formed simultaneously with the scanning line 3a which is described with reference to FIGS. 4A and 4B. In addition, parts of both the high-electric potential line 77 and the low-electric potential line 78 that extend in direction Y that is parallel to the data line 6a are formed of the conduction film that is formed simultaneously with the data line 6a which is described with reference to FIGS. 4A and 4B. In addition, the part that extends in the direction for intersecting the data line 6a and the part that extends parallel to the data line 6a are electrically connected through a contact hole that is formed in the insulation film.

The high-electric potential protection diode 97 is formed of an MIS-type diode element that is formed by connecting the drain and the gate of an MIS-type semiconductor element having an approximately same configuration as that of the field effect transistor 30 described with reference to FIGS. 4A and 4B. In other words, the high-electric potential protection diode 97 has the bottom-gate structure in which a gate electrode 3g, a gate insulation film 21, a semiconductor film 1i that is formed of an amorphous silicon film, and contact layers 4i and 4j that are formed of an amorphous silicon film in which high-density N-type impurities are doped are laminated in the described order. An end part of the semiconductor film 1i on the source side is overlapped with a source electrode 6j through the contact layer 4i. In addition, an end part of the semiconductor film 1i on the drain side is overlapped with a part of the data line 6a through the contact layer 4i. In addition, on the surface side of the source electrode 6j and the data line 6a, a lower-layer insulation film 22 is formed, and in an upper layer of the lower-layer insulation film 22, a relay electrode 81g that is formed simultaneously with the first electrode 81a of the photoelectric conversion element 80 which is described with reference to FIGS. 4A and 4B is formed.

The relay electrode 81g is electrically connected to the source electrode 6j through the contact holes 22j that is formed in the lower-layer insulation film 22. In addition, the relay electrode 81g is electrically connected to the high-electric potential line 77 through the contact hole 22i that is formed in the lower-layer insulation film 22 and the gate insulation film 21. In the high-electric potential protection diode 97 configured as above, the source that is connected to the high-electric potential line 77 side serves as a cathode, and the drain that is connected to the data line 6a side serves as an anode.

Although the section of the low-electric potential protection diode 98 is not shown in the figure, as shown in FIG. 13B, similarly to the high-electric potential protection diode 97, is formed of an MIS-type diode element that is formed by connecting the drain and the gate of the MIS-type semiconductor element having an approximate same configuration as that of the field effect transistor 30 which is described with reference to FIGS. 4A and 4B. In other words, the low-electric potential protection diode 98 has the bottom-gate structure in which a gate electrode 3e, the gate insulation film 21, a semiconductor film 1j that is formed of an amorphous silicon film, and a contact layer that is formed of an amorphous silicon film in which high-density N-type impurities are doped are laminated in the described order. An end part of the semiconductor film 1j on the drain side is overlapped with a drain electrode 6k through the contact layer. In addition, an end part of the semiconductor film 1j on the source side is overlapped with a part of the data line 6a through the contact layer. In addition, on the surface side of the drain electrode 6k and the data line 6a, the lower-layer insulation film 22 is formed, and in an upper layer of the lower-layer insulation film 22, a relay electrode 81h that is formed simultaneously with the first electrode 81a of the photoelectric conversion element 80 which is described with reference to FIGS. 4A and 4B is formed. Here, the relay electrode 81h is electrically connected to the drain electrode 6k through a contact hole 22m that is formed in the lower-layer insulation film 22. In addition, the relay electrode 81h is electrically connected to the gate electrode 3h and the low-electric potential line 78 through contact holes 22p and 22r that are formed in the lower-layer insulation film 22 and the gate insulation film 21. In the low-electric potential protection diode 98 configured as above, the drain that is connected to the low-electric potential line 78 side serves as an anode, and the source that is connected to the data line 6a side serves as a cathode.

Although, in the electrostatic protection circuit 7c configured as above, two protection diodes (the high-electric potential protection diode 97 and the low-electric potential protection diode 98) are connected to one data line 6a, a sum W1 of channel widths of the high-electric potential protection diode 97 and the low-electric potential protection diode 98 that are connected to one data line 6a is set to be smaller than a sum W2 of the channel widths of the field effect transistors 30 of each pixel 10a that are connected to one data line 6a. Accordingly, even when the electric potential of the data line 6a leaks through the high-electric potential protection diode 97 and the low-electric potential protection diode 98, the influence of the leakage can be negligible. It is preferable that the sum W1 of the channel widths of the high-electric potential protection diode 97 and the low-electric potential protection diode 98 is smaller than 1/10 times the sum W2 of the channel widths of the field effect transistors 30 of each pixel 100a that are connected to one data line 6a. In addition, it is more preferable that the sum W1 of the channel widths is smaller than 1/100 times the sum W2 of the channel widths of the field effect transistors 30 of each pixel 100a. In other words, when the channel width of the field effect transistor 30 of each pixel 100a is about 10 μm and the number N of connections is 100, the sum W1 of the channel widths of the high-electric potential protection diode 97 and the low-electric potential protection diode 98 is preferably equal to or smaller than 1 mm, is more preferably equal to or small than 100 μm, and is much more preferably equal to or smaller than 10 μm. Further, even when the electric potential of the data line 6a leaks through the field effect transistors 30 of each pixel 100a, the influence of the leakage can be negligible.

In the electrostatic protection circuit 7c, it is needed that an electric potential equal to or higher than the highest electric potential applied to the data line 6a is applied to the high-electric potential line 77 and an electric potential equal to or lower than the lowest electric potential applied to the data line 6a is applied to the low-electric potential line 78. Here, as described with reference to FIG. 5, after the data line 6a is set to the preset electric potential Vp, the electric potential of the data line 6a is moved to the high-electric potential side by the feed-through electric potential V1. The feed-through voltage V1 is an electric potential by which the electric potential of the data line 6a is changed at a time when the gate voltage is the gate-on voltage Vgh. Here, when parasitic capacitance (the parasitic capacitance of the field effect transistor 30, the capacitance of the crossed part of the scanning line 3a and the data line 6a, and the like) between the scanning line 3a and the data line 6a of one pixel is denoted by CP, and the data line capacitance is denoted by Cd, the following expression is acquired.

$$(Cp/Cd) \times (Vgh-Vgl)$$

As a result, the highest value of the electric potential applied to the data line 6a is a sum of the preset voltage Vp and the feed-through voltage V1. Although the feed-through voltage V1 has a value depending on the design, generally, the feed-through voltage is equal to or smaller than 1 V. Thus, according to this embodiment, an electric potential that is higher than the preset voltage Vp by 1 V or more is applied to the high-electric potential line 77.

As described above, according to this embodiment, in the electrostatic protection circuit 7c for the data line 6a, the high-electric potential protection diode 97 having the reverse-biased state is disposed between the data line 6a and the high-electric potential line 77, and the low-electric potential protection diode 98 having the reverse-biased state is disposed between the data line 6a and the low-electric potential line 78. Accordingly, in the electrostatic protection circuit 7c, the high-electric potential protection diode 97 and the low-electric potential protection diode 98 are in the reverse-biased state all the time. Thus, even when the electrostatic protection circuit 7c is provided for the data line 6a, the leak current flowing from the data line 6a can be formed to have a very low level. In addition, since individual constant electric potential lines (the high-electric potential line 77 and the low-electric potential line 78) are disposed in the data line 6a, an electric potential that is appropriate for the data line 6a can be set in the high-electric potential line 77 and the low-electric potential line 78. Accordingly, in the current to voltage characteristics shown in FIG. 8A, the reverse-biased voltage applied to the high-electric potential protection diode 97 and the low-electric potential protection diode 98 is low. Thus, even when the electrostatic protection circuit 7c is provided for the data line 6a, the leak current flowing from the data line 6a has a negligible level. As a result, according to this embodiment, there is no deterioration of an electrical signal that is generated in accordance with light received by each pixel 100a due to the leak current flowing from the data line 6a, and therefore, a solid-state image pickup device 100 having high resolution can be implemented.

In addition, according to this embodiment, the bias voltage VB is applied to the low-electric potential line 78 of the electrostatic protection circuit 7c. Thus, when a power source circuit that generates an electric potential to be applied to the high-electric potential line 77 is appropriately disposed as a new power source circuit, there is an advantage that the circuit configuration of the power source unit can be simplified.

Other Embodiments

In the above-described Embodiment 1, as shown in FIG. 2A, the drain of the field effect transistor is electrically connected to the first electrode 81a (cathode) of the photoelectric conversion element 80, and the bias line 5a is electrically connected to the second electrode 85a (anode) of the photoelectric conversion element 80. However, as shown in FIG. 2B, a configuration in which the first electrode 81a of the photoelectric conversion element 80 electrically connected to the drain of the field effect transistor is used as the anode may be employed. In such a case, the second electrode 85a of the photoelectric conversion element 80 that is electrically connected to the bias line 5a becomes the cathode. As a detailed example, a high-density P-type semiconductor layer 84a, an I-type semiconductor layer 83, and a high-density N-type semiconductor layer 83a may be sequentially formed on the first electrode 81a. Under the configuration shown in FIG. 2B, basic operations including application of the reverse bias to the photoelectric conversion element 80 through the bias line 5a are the same as those under the configuration shown in FIG. 2A. However, the height of the electric potential levels of signals, as shown in FIG. 14, is different from that of the pattern shown in FIG. 5. Accordingly, for example, in Embodiment 5, an electric potential that is higher than the preset electric potential Vp by 1 V is applied to the high-electric potential line 77, and the bias voltage is applied to the low-electric potential line 78. However, under the configuration shown in FIG. 2B, it is preferable that an electric potential that is lower than the preset voltage Vp by 1 V is applied to the low-electric potential line 78, and the bias voltage VB is applied to the high-electric potential line 77.

In addition, in the above-described Embodiments 1 to 5, the PIN photo diode is used as the photoelectric conversion element 80. However, the invention is not limited thereto, and a PN photo diode may be used as photoelectric conversion element 80. Furthermore, a photoelectric conversion element 80 of the MIS type or the Schottky type may be used.

In the above-described Embodiments 1 to 5, an example in which the TFT using an amorphous silicon film 1s used as the field effect transistor 30 has been described. However, a thin film transistor using a microcrystalline silicon film, a poly-silicon film, a monocrystalline silicon layer, or the like may be used as the field effect transistor 30. In addition, in the above-described Embodiments 1 to 5, the field effect transistor 30 has the bottom-gate structure in which the gate electrode 3b, the gate insulation film 21, and the semiconductor film 2a (active layer) are sequentially laminated from the lower-layer side of the base substrate 10 toward the upper-layer side. However, the field effect transistor may have a top-gate structure in which the semiconductor film (active layer), the gate insulation film, and the gate electrode are sequentially laminated from the lower-layer side of the base substrate 10 toward the upper-layer side. In a case where the top-gate structure is employed, when light is configured to be incident from the side of the gate electrode, by using a transparent conduction film such as an ITO film as the gate electrode, incidence of light to the active layer can be performed effectively. In addition, as the structure of the field effect transistor 30, any of a staggered type, an inversely staggered type, a coplanar type, and an inversely coplanar type may be used.

In addition, in the above-described Embodiments 1 to 5, the N-type field effect transistor 30 is used as the pixel switching element. However, a P-type field effect transistor 30 may be used as the pixel switching element. In such a case, by inverting the polarities in the descriptions above, the configurations that are the same as those of the above-described Embodiments 1 to 5 can be implemented.

The entire disclosure of Japanese Patent Application No. 2008-151384, filed Jun. 10, 2008 is expressly incorporated by reference herein.

What is claimed is:

1. A solid state image pickup device comprising:
a scanning line extending in a predetermined direction;
a constant electric potential line for electrostatic protection;
a data line extending in a direction for intersecting the scanning line,
a bias line;
a pixel disposed in a position corresponding to an intersection of the scanning line and the data line;
a field effect transistor that is controlled by the scanning line;
a photoelectric conversion element that has a first electrode electrically connected to the data line through the field effect transistor and a second electrode electrically connected to the bias line; and
an electrostatic protection circuit having a protection diode electrically connected between the bias line and the constant electric potential line for electrostatic protection.

2. The solid-state image pickup device according to claim 1, wherein, for at least one signal line between the scanning line and the data line, a signal line electrostatic protection circuit having a protection diode that is electrically connected between the at least one signal line and the constant electric potential line for electrostatic protection is configured.

3. The solid-state image pickup device according to claim 1,
wherein, for the scanning line, a scanning line electrostatic protection circuit having a protection diode that is electrically connected between the scanning line and the constant electric potential line for electrostatic protection is configured, and
wherein, for the data line, a data line electrostatic protection circuit having a protection diode that is electrically connected between the data line and the constant electric potential line for electrostatic protection is configured.

4. The solid-state image pickup device according to claim 2, wherein all the protection diodes are electrically connected to the common constant electric potential line for electrostatic protection.

5. The solid-state image pickup device according to claim 4,
wherein, on the substrate, a plurality of the constant electric potential lines for electrostatic protection is formed, and the plurality of the constant electric potential lines for electrostatic protection are electrically connected in series through the protection diodes, and
wherein, among the plurality of the constant electric potential lines for electrostatic protection, the protection diode of the electrostatic protection circuit is electrically connected to the constant electrical potential lines other than the constant electric potential line for electrostatic protection to which a constant electric potential is directly applied.

6. The solid-state image pickup device according to claim 4, wherein the electric potential that is applied to the constant electric potential line for electrostatic protection is a preset voltage that is applied to the data line prior to reading data from the pixel.

7. The solid-state image pickup device according to claim 1, wherein the protection diode is at least a reverse-biased diode element in which two MIS-type diodes each formed by connecting the drain or the source of the MIS-type semiconductor element to the gate are connected in parallel in the reverse direction.

8. The solid-state image pickup device according to claim 1, wherein, as the protection diode, a reverse-biased diode having at least a high-electric potential protection diode that is electrically connected to the constant electric potential line for electrostatic protection, which has a high electric potential, in a reverse-biased state and a low-electric potential protection diode, which is electrically connected to the constant electric potential line for electrostatic protection having a low electric potential in a reverse-biased state, among the constant electric potential lines for electrostatic protection, are used.

* * * * *